United States Patent
Kobayashi et al.

(10) Patent No.: US 12,336,257 B2
(45) Date of Patent: Jun. 17, 2025

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Yusuke Kobayashi, Nagareyama (JP); Tatsuo Shimizu, Shinagawa (JP); Tomoaki Inokuchi, Yokohama (JP); Hiro Gangi, Ota (JP); Hiroki Nemoto, Fuchu (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 732 days.

(21) Appl. No.: 17/585,790

(22) Filed: Jan. 27, 2022

(65) Prior Publication Data

US 2022/0393008 A1     Dec. 8, 2022

(30) Foreign Application Priority Data

Jun. 2, 2021 (JP) ................. 2021-092780

(51) Int. Cl.
*H10D 64/23* (2025.01)
*H10D 30/01* (2025.01)
(Continued)

(52) U.S. Cl.
CPC ......... *H10D 64/258* (2025.01); *H10D 30/025* (2025.01); *H10D 64/01* (2025.01);
(Continued)

(58) Field of Classification Search
CPC combination set(s) only.
See application file for complete search history.

(56) References Cited

U.S. PATENT DOCUMENTS

| 8,198,678 B2 | 6/2012 | Mauder et al. |
| 8,587,054 B2 * | 11/2013 | Hsieh ................ H10D 30/0295 257/331 |

(Continued)

FOREIGN PATENT DOCUMENTS

| JP | 2007-194283 A | 8/2007 |
| JP | 2014-78741 A | 5/2014 |

(Continued)

*Primary Examiner* — Khaja Ahmad
*Assistant Examiner* — Khatib A Rahman
(74) *Attorney, Agent, or Firm* — Oblon, McClelland, Maier & Neustadt, L.L.P.

(57) ABSTRACT

According to one embodiment, a semiconductor device includes first to third electrodes, a first conductive member, a semiconductor member, and a first insulating member. The third electrode includes a third electrode end portion and a third electrode other end portion. The third electrode end portion is between the first electrode and the third electrode other end portion. The first conductive member includes a first conductive member end portion and a first conductive member other end portion. The first conductive member end portion is between the first electrode and the first conductive member other end portion. The semiconductor member includes first to third semiconductor regions. The first semiconductor region includes first and second partial regions. The first insulating member includes silicon and oxygen. The first insulating member includes a first element including at least one selected from the group consisting of nitrogen, aluminum, hafnium and zirconium at the third position.

17 Claims, 22 Drawing Sheets

(51) Int. Cl.
    *H10D 30/63*    (2025.01)
    *H10D 64/00*    (2025.01)
    *H10D 64/01*    (2025.01)
    *H10D 64/27*    (2025.01)

(52) U.S. Cl.
    CPC ........... *H10D 64/111* (2025.01); *H10D 30/63* (2025.01); *H10D 64/513* (2025.01)

(56) References Cited

U.S. PATENT DOCUMENTS

| | | | |
|---|---|---|---|
| 9,691,846 B2 | 6/2017 | Oka et al. | |
| 2007/0138547 A1* | 6/2007 | Nakamura | H10D 64/117 257/331 |
| 2007/0187695 A1 | 8/2007 | Nakamura et al. | |
| 2007/0210356 A1* | 9/2007 | Henson | H10D 30/668 257/E29.066 |
| 2012/0061723 A1* | 3/2012 | Ishii | H10D 30/0297 257/E29.198 |
| 2013/0062688 A1* | 3/2013 | Kobayashi | H10D 30/668 257/330 |
| 2014/0077278 A1* | 3/2014 | Nozu | H10D 30/0297 257/773 |
| 2016/0020287 A1* | 1/2016 | Hirler | H10D 12/00 257/331 |
| 2016/0087064 A1 | 3/2016 | Ohashi et al. | |
| 2016/0268420 A1* | 9/2016 | Arai | H10D 64/117 |
| 2020/0058778 A1 | 2/2020 | Fukunaga et al. | |
| 2020/0295150 A1* | 9/2020 | Nishiwaki | H10D 64/117 |

FOREIGN PATENT DOCUMENTS

| | | |
|---|---|---|
| JP | 2016-66641 A | 4/2016 |
| JP | 2016-111253 A | 6/2016 |
| JP | 2018-181933 A | 11/2018 |
| WO | WO 2018/078775 A1 | 5/2018 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2021-092780, filed on Jun. 2, 2021; the entire contents of which are incorporated herein by reference.

FIELD

Embodiments described herein generally relate to a semiconductor device and a method for manufacturing the same.

BACKGROUND

For example, in a semiconductor device such as a transistor, improvement in characteristics is desired.

DETAILED DESCRIPTION

Figure 1:
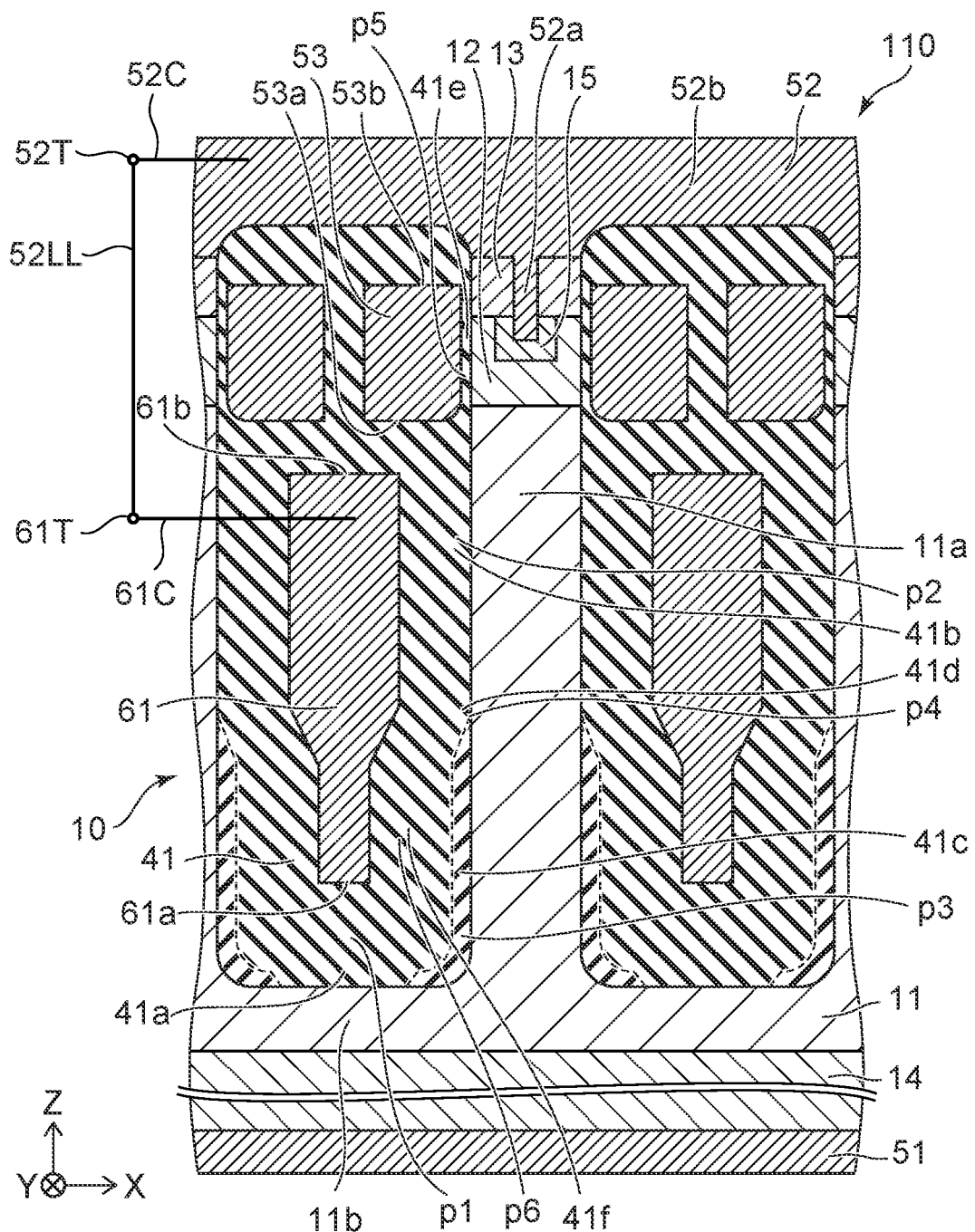
FIG. 1 is a schematic cross-sectional view illustrating a semiconductor device according to a first embodiment.

According to one embodiment, a semiconductor device includes a first electrode, a second electrode, a third electrode, a first conductive member, a semiconductor member, and a first insulating member. A direction from the first electrode to the second electrode is along a first direction. The third electrode includes a third electrode end portion and a third electrode other end portion. The third electrode end portion is located between the first electrode and the third electrode other end portion in the first direction. The first conductive member includes a first conductive member end portion and a first conductive member other end portion. The first conductive member end portion is located between the first electrode and the first conductive member other end portion in the first direction. A position of the first conductive member end portion in the first direction is between a position of the first electrode in the first direction and a position of the third electrode end portion in the first direction. The first conductive member is electrically connected with one of the second electrode and the third electrode, or the first conductive member is configured to be electrically connected with the one of the second electrode and the third electrode. The semiconductor member includes a first semiconductor region of a first conductive type, a second semiconductor region of a second conductive type, and a third semiconductor region of the first conductive type. The first semiconductor region includes a first partial region and a second partial region. The first partial region is located between the first electrode and the second electrode in the first direction. The second semiconductor region is located between the first partial region and the third semiconductor region in the first direction. The third semiconductor region is electrically connected with the second electrode. A second direction from a part of the third electrode to the second semiconductor region crosses the first direction. A direction from an other part of the third electrode to a part of the first partial region is along the second direction. A direction from the second partial region to the first conductive member is along the first direction. A direction from the first conductive member to the first partial region is along the second direction. The first insulating member includes silicon and oxygen. The first insulating member includes a first position, a second position, and a third position. The first position is between the second partial region and the first conductive member end portion in the first direction. The second position is between the first conductive member and the first partial region in the second direction. A direction from the first position to the third position is along the second direction. A position of the third position in the first direction is between a position of the second partial region in the first direction and a position of the second position in the first direction. The first insulating member includes a first element including at least one selected from the group consisting of nitrogen, aluminum, hafnium and zirconium at the third position. The first insulating member does not include the first element at the first position and the second position, or each of a concentration of the first element at the first position and a concentration of the first element at the second position is lower than a concentration of the first element at the third position.

According to one embodiment, a semiconductor device includes a first electrode, a second electrode, a third electrode, a first conductive member, a semiconductor member, and a first insulating member. A direction from the first electrode to the second electrode is along a first direction. The third electrode includes a third electrode end portion and a third electrode other end portion. The third electrode end portion is located between the first electrode and the third electrode other end portion in the first direction. The first conductive member includes a first conductive member end portion and a first conductive member other end portion. The first conductive member end portion is located between the first electrode and the first conductive member other end portion in the first direction. A position of the first conductive member end portion in the first direction is between a position of the first electrode in the first direction and a position of the third electrode end portion in the first direction. The first conductive member is electrically connected with one of the second electrode and the third electrode, or the first conductive member is configured to be electrically connected with the one of the second electrode and the third electrode. The semiconductor member includes a first semiconductor region of a first conductive type, a second semiconductor region of a second conductive type, and a third semiconductor region of the first conductive type. The first semiconductor region includes a first partial region and a second partial region. The first partial region is located between the first electrode and the second electrode in the first direction. The second semiconductor region is located between the first partial region and the third semiconductor region in the first direction. The third semiconductor region is electrically connected with the second electrode. A second direction from a part of the third electrode to the second semiconductor region crosses the first direction. A direction from an other part of the third electrode to a part of the first partial region is along the second direction. A direction from the second partial region to the first conductive member is along the first direction. A direction from the first conductive member to the first partial region is along the second direction. The first insulating member includes silicon and oxygen. The first insulating member includes a first insulating region, a second insulating region, and a third insulating region. The first insulating region is located between the second partial region and the first conductive member end portion in the first direction. The second insulating region is located between the first conductive member and the first partial region in the second direction. A direction from the first insulating region to at least a part of the third insulating region is along the second direction. A position of the third insulating region in the first direction is between a position of the second partial region in the first direction and a position of the second insulating region in a first direction. The third insulating region includes a first element including at least one selected from the group consisting of nitrogen, aluminum, hafnium and zirconium. The first insulating region and the second insulating region do not include the first element, or each of a concentration of the first element in the first insulating region and a concentration of the first element in the second insulating region is lower than a concentration of the first element in the third insulating region.

According to one embodiment, a semiconductor device includes a first electrode, a second electrode, a third electrode, a first conductive member, a semiconductor member, and a first insulating member. A direction from the first electrode to the second electrode is along a first direction. The third electrode includes a third electrode end portion and a third electrode other end portion. The third electrode end portion is located between the first electrode and the third electrode other end portion in the first direction. The first conductive member includes a first conductive member end portion and a first conductive member other end portion. The first conductive member end portion is located between the first electrode and the first conductive member other end portion in the first direction. A position of the first conductive member end portion in the first direction is between a position of the first electrode in the first direction and a position of the third electrode end portion in the first direction. The first conductive member is electrically connected with one of the second electrode and the third electrode, or the first conductive member is configured to be electrically connected with the one of the second electrode and the third electrode. The semiconductor member includes a first semiconductor region of a first conductive type, a second semiconductor region of a second conductive type, and a third semiconductor region of the first conductive type. The first semiconductor region includes a first partial region and a second partial region. The first partial region is located between the first electrode and the second electrode in the first direction. The second semiconductor region is located between the first partial region and the third semiconductor region in the first direction. The third semiconductor region is electrically connected with the second electrode. A second direction from a part of the third electrode to the second semiconductor region crosses the first direction. A direction from an other part of the third electrode to a part of the first partial region is along the second direction. A direction from the second partial region to the first conductive member is along the first direction. A direction from the first conductive member to the first partial region is along the second direction. The first insulating member includes silicon and oxygen. The first insulating member includes a first insulating region, a second insulating region, and a third insulating region. The first insulating region is located between the second partial region and the first conductive member end portion in the first direction. The second insulating region is located between the first conductive member and the first partial region in the second direction. A direction from the first insulating region to at least a part of the third insulating region is along the second direction. A position of the third insulating region in the first direction is between a position of the second partial region in the first direction and a position of the second insulating region in a first direction. The third insulating region includes a first region including a first element, the first element including at least one selected from the group consisting of nitrogen, aluminum, hafnium and zirconium, a second region including the first element, and a first intermediate region provided between the first region and the second region. The first region is located between a part of the second region and the first partial region in the second direction. The first intermediate region does not include the first element, or a concentration of the first element in the first intermediate region is lower than a concentration of the first element in the first region, and lower than a concentration of the first element in the second region. The first insulating region and the second insulating region do not include the first element, or each of a concentration of the first element in the first insulating region and a concentration of the first element in the second insulating region is lower than the concentration of the first element in the first region and lower than the concentration of the first element in the second region.

According to one embodiment, a method for manufacturing a semiconductor device is disclosed. The method can include forming a first film on a bottom surface, a lower side surface and an upper side surface of a hole of a semiconductor member. The hole includes the bottom surface, the lower side surface, and the upper side surface. The first element includes at least one selected from the group consisting of nitrogen, aluminum, hafnium and zirconium. A distance between the lower side surface and the bottom surface is shorter than a distance between the upper side surface and the bottom surface. The first film includes a first bottom surface region provided on the bottom surface, a first lower side surface region provided on the lower side surface, and a first upper side surface region provided on the upper side surface. The method can include removing the first bottom surface region and the first upper side surface region while leaving the first lower side surface region. The method can include forming a second film including a second element on the bottom surface, the first lower side surface region, and the upper side surface. The second element includes at least one selected from the group consisting of nitrogen, aluminum, hafnium and zirconium. The second film includes a second bottom surface region provided on the bottom surface, a second lower side surface region provided on the first lower side surface region, and a second upper side surface region provided on the upper side surface. The method can include removing the second bottom surface region and the second upper side surface region while leaving the second lower side surface region. The method can include forming a second insulating film including silicon and oxygen on the bottom surface, the second lower side surface region, and the upper side surface. In addition, the method can include forming a first conductive member in the hole after the forming the second insulating film.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a first conductive member 61, a semiconductor member 10, and a first insulating member 41.

A direction from the first electrode 51 to the second electrode 52 is along a first direction. The first direction is a Z-axis direction. One direction perpendicular to the Z-axis direction is defined as an X-axis direction. The direction perpendicular to the Z-axis direction and the X-axis direction is defined as a Y-axis direction.

The third electrode 53 includes a third electrode end portion 53a and a third electrode other end portion 53b. The third electrode end portion 53a is located between the first electrode 51 and the third electrode other end portion 53b in the first direction (Z-axis direction). The third electrode end portion 53a is an end portion on a side of the first electrode 51. The third electrode other end portion 53b is an end on a side of the second electrode 52.

The first conductive member 61 includes a first conductive member end portion 61a and a first conductive member other end portion 61b. The first conductive member end portion 61a is located between the first electrode 51 and the first conductive member other end portion 61b in the first direction (Z-axis direction). The first conductive member end portion 61a is an end portion on a side of the first electrode 51. The first conductive member other end portion 61b is an end on a side of the second electrode 52. The position of the first conductive member end portion 61a in the first direction (Z-axis direction) is between the position of the first electrode 51 in the first direction and the position of the third electrode end portion 53a in the first direction.

The first conductive member 61 is electrically connected with one of the second electrode 52 and the third electrode 53. Alternatively, the first conductive member 61 is configured to eb electrically connected with one of the second electrode 52 and the third electrode 53. In the semiconductor device 110, the first conductive member 61 is electrically connected with the second electrode 52.

For example, as shown in FIG. 1, the first conductive member 61 is electrically connected with the second electrode 52 via the connecting member 61C, the connecting member 52LL, and the connecting member 52C. These connecting members may be provided at a position different from the cross section illustrated in FIG. 1. For example, a terminal 52T may be connected with the second electrode 52 via the connecting member 52C. The terminal 61T may be electrically connected with the first conductive member 61 via the connecting member 61C. The terminal 61T may be electrically connected with the terminal 52T by the connecting member 52LL. The connecting member 52LL may be provided separately from the semiconductor device 110.

The semiconductor member 10 is, for example, located between the first electrode 51 and the second electrode 52. The semiconductor member 10 includes, for example, a semiconductor such as silicon.

The semiconductor member 10 includes a first semiconductor region 11 of a first conductive type, a second semiconductor region 12 of a second conductive type, and a third semiconductor region 13 of the first conductive type. As shown in FIG. 1, the semiconductor member 10 may further include a fourth semiconductor region 14. As shown in FIG. 1, the semiconductor member 10 may further include a fifth semiconductor region 15.

For example, the first conductive type is n-type and the second conductive type is p-type. In the embodiment, the first conductive type may be p-type and the second conductive type may be n-type. In the following example, the first conductive type is n-type and the second conductive type is p-type.

The first semiconductor region 11 includes a first partial region 11a and a second partial region 11b. For example, the first partial region 11a is located between the first electrode 51 and the second electrode 52 in the first direction (Z-axis direction).

The second semiconductor region 12 is located between the first partial region 11a and the third semiconductor region 13 in the first direction (Z-axis direction). For example, the first partial region 11a, the second semiconductor region 12, and the third semiconductor region 13 are located between the first electrode 51 and the second electrode 52. The third semiconductor region 13 is electrically connected with the second electrode 52.

A second direction from a part of the third electrode 53 to the second semiconductor region 12 crosses the first direction. The second direction is, for example, the X-axis direction.

A direction from another part of the third electrode 53 to a part of the first partial region 11a is along the second direction (for example, the X-axis direction).

A direction from the second partial region 11b of the first semiconductor region 11 to the first conductive member 61 is along the first direction (Z-axis direction). A direction from the first conductive member 61 to the first partial region 11a is along the second direction (for example, the X-axis direction).

The fourth semiconductor region 14 is provided between the first electrode 51 and the first semiconductor region 11 in the first direction (Z-axis direction). The fourth semiconductor region 14 is of the first conductive type (for example, n type). The fourth semiconductor region 14 is electrically connected with the first electrode 51. The fourth semiconductor region 14 may include, for example, a semiconductor substrate.

A carrier concentration of the first conductive type in the fourth semiconductor region 14 is higher than a carrier concentration of the first conductive type in the first semiconductor region 11. The first semiconductor region 11 is, for example, an n region or an n$^-$ region. The fourth semiconductor region 14 is, for example, an n$^+$ region. By providing the fourth semiconductor region 14, the resistance of the electrical connection of the first electrode 51 can be reduced. For example, a low on-resistance is obtained.

A carrier concentration of the first conductive type in the third semiconductor region 13 is higher than the carrier concentration of the first conductive type in the first semiconductor region 11. The third semiconductor region 13 is, for example, an n$^+$ region.

When the fifth semiconductor region 15 is provided, the fifth semiconductor region 15 is provided, for example, between the second semiconductor region 12 and the second electrode 52. The fifth semiconductor region 15 is of the second conductive type (for example, p type). A carrier concentration of the second conductive type in the fifth semiconductor region 15 is higher than a carrier concentration of the second conductive type in the second semiconductor region 12. For example, the second semiconductor region 12 is the p region. The fifth semiconductor region 15 is a p$^+$ region. By providing the fifth semiconductor region 15, the resistance of the electrical connection of the second electrode 52 can be reduced. For example, a low on-resistance is obtained.

In this example, the second electrode 52 includes a portion 52a and a portion 52b. The fifth semiconductor region 15 is located between the second semiconductor region 12 and the portion 52a. The third electrode 53 is located between the first electrode 51 and the portion 52b.

The first insulating member 41 includes silicon and oxygen. As will be described later, a part of the first insulating member 41 includes, for example, SiO$_2$. Another part of the first insulating member 41 may include another element (first element described later).

The first insulating member 41 is located between the third electrode 53 and the semiconductor member 10 and between the first conductive member 61 and the semiconductor member 10. The first insulating member 41 electrically insulates between the third electrode 53 and the semiconductor member 10. The first conductive member 61 electrically insulates between the first conductive member 61 and the semiconductor member 10. A part of the first insulating member 41 (for example, the fifth insulating region 41e described later) is located between the third electrode 53 and the second semiconductor region 12.

For example, a current flowing between the first electrode 51 and the second electrode 52 can be controlled by a potential of the third electrode 53. The potential of the third electrode 53 is, for example, a potential based on a potential of the second electrode 52. The first electrode 51 functions as, for example, a drain electrode. The second electrode 52 functions as, for example, a source electrode. The third electrode 53 functions as, for example, a gate electrode. A part of the first insulating member 41 functions as, for example, a gate insulating film. The first conductive member 61 functions as, for example, a field plate. The semiconductor device 110 is, for example, a transistor.

As shown in FIG. 1, the first insulating member 41 includes a first position p1, a second position p2, and a third position p3. The first position p1 is located between the second partial region 11b and the first conductive member end portion 61a in the first direction (Z-axis direction). The second position p2 is between the first conductive member 61 and the first partial region 11a in the second direction (X-axis direction). A direction from the first position p1 to the third position p3 is along the second direction (for example, the X-axis direction). The position of the third position p3 in the first direction (Z-axis direction) is located between the position of the second partial region 11b in the first direction and the position of the second position p2 in the first direction.

The first insulating member 41 includes a first element at the third position p3. The first element includes at least one selected from the group consisting of nitrogen, aluminum, hafnium and zirconium. The first insulating member 41 does not include the first element at the first position p1 and the second position p2. Alternatively, each of the concentration of the first element at the first position p1 and the concentration of the first element at the second position p2 is lower than the concentration of the first element at the third position p3. In one example, the third position p3 comprises, for example, SiON. For example, the third position p3 may include, for example, at least one oxide selected from the group consisting of aluminum, hafnium and zirconium.

For example, the first insulating member 41 includes a first insulating region 41a, a second insulating region 41b, and a third insulating region 41c. The first insulating region 41a includes the first position p1 described above. The second insulating region 41b includes the second position p2 described above. The third insulation region 41c includes the third position p3 described above.

The first insulating region 41a is located between the second partial region 11b and the first conductive member end portion 61a in the first direction (Z-axis direction). The second insulating region 41b is located between the first conductive member 61 and the first partial region 11a in the second direction (X-axis direction).

A direction from the first insulating region 41a to at least a part of the third insulating region 41c is along the second direction (X-axis direction). The position of the third insulating region 41c in the first direction (Z-axis direction) is located between the position of the second partial region 11*b* in the first direction and the position of the second insulating region 41*b* in the first direction.

The third insulating region 41*c* includes the first element including at least one selected from the group consisting of nitrogen, aluminum, hafnium and zirconium. The first insulating region 41*a* and the second insulating region 41*b* do not include the first element. Alternatively, each of the concentration of the first element in the first insulating region 41*a* and the concentration of the first element in the second insulating region 41*b* is lower than the concentration of the first element in the third insulating region 41*c*. In one example, the third insulation region 41*c* includes, for example, SiON. For example, the third insulating region 41*c* may include, for example, at least one oxide selected from the group consisting of aluminum, hafnium and zirconium.

With such a configuration, for example, a high breakdown voltage can be obtained. It is considered that this is because the first element described above functions as an electric charge (for example, a fixed charge). For example, local concentration of the electric field can be suppressed in the vicinity of the first conductive member 61. According to the embodiment, for example, a high breakdown voltage and a low on-resistance can be obtained. According to the embodiment, it is possible to provide a semiconductor device whose characteristics can be improved.

Figure 2:
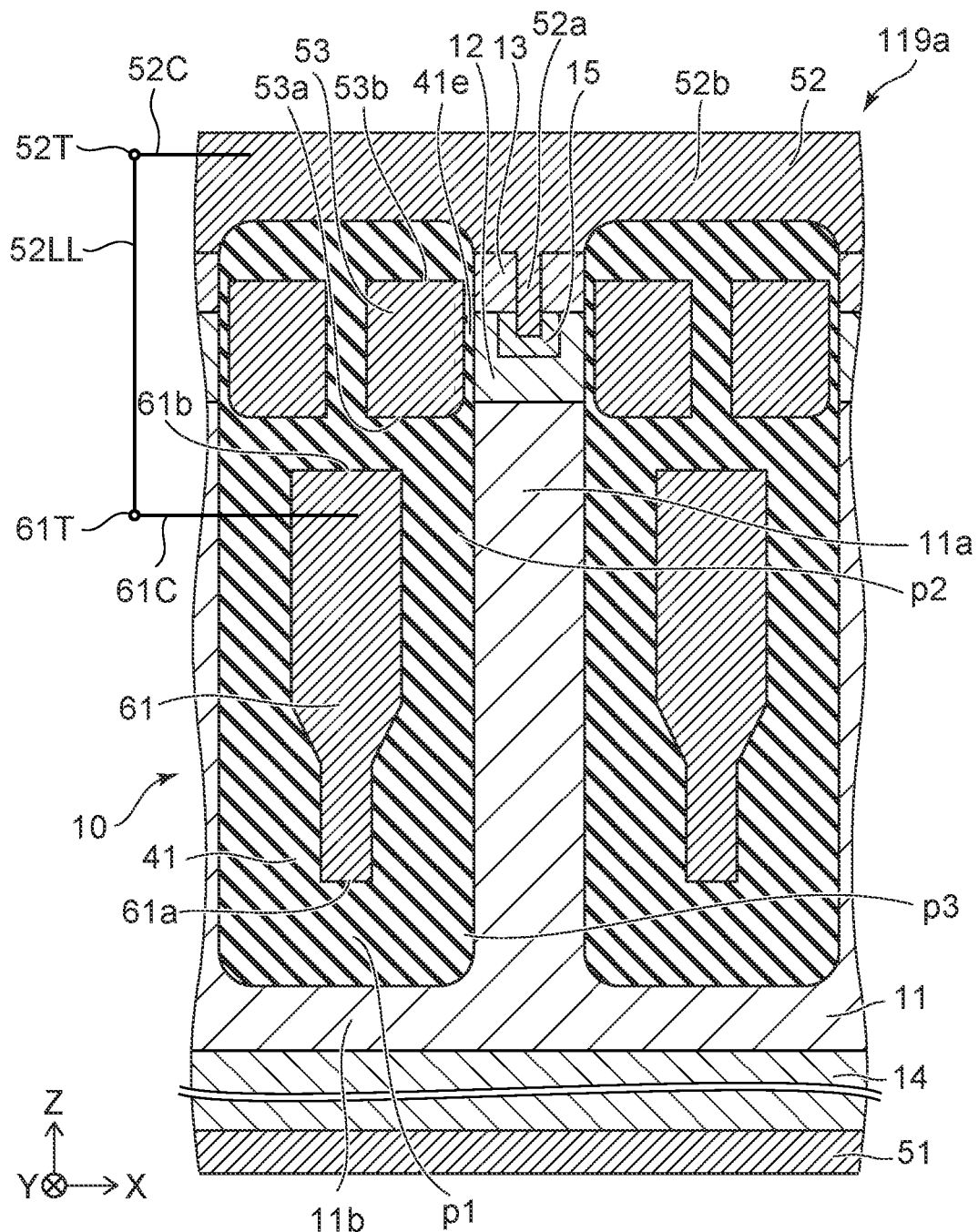
FIG. 2 is a schematic cross-sectional view illustrating a semiconductor device of a reference example.
Figure 3:
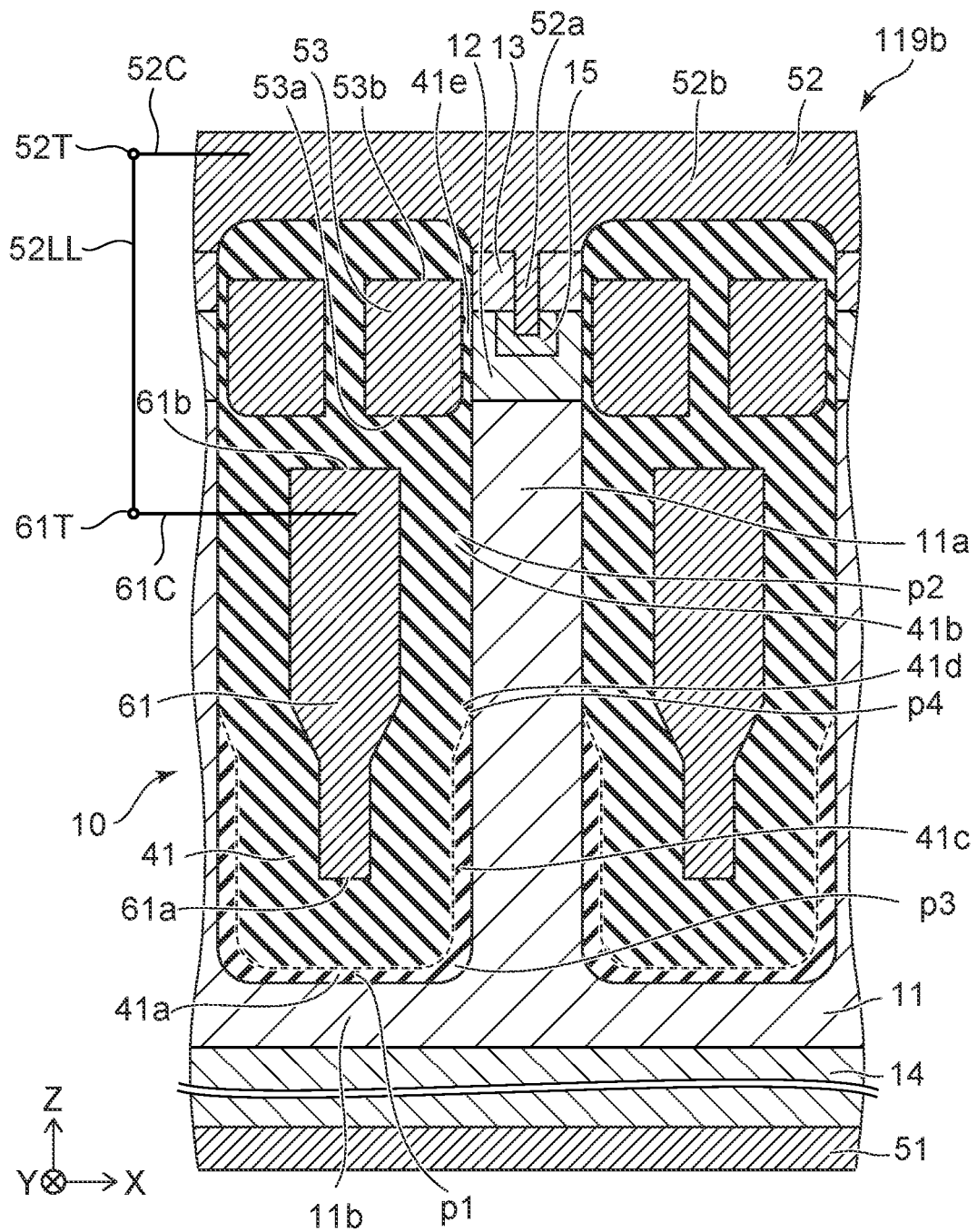
FIG. 3 is a schematic cross-sectional view illustrating a semiconductor device of a reference example.
Figure 4:
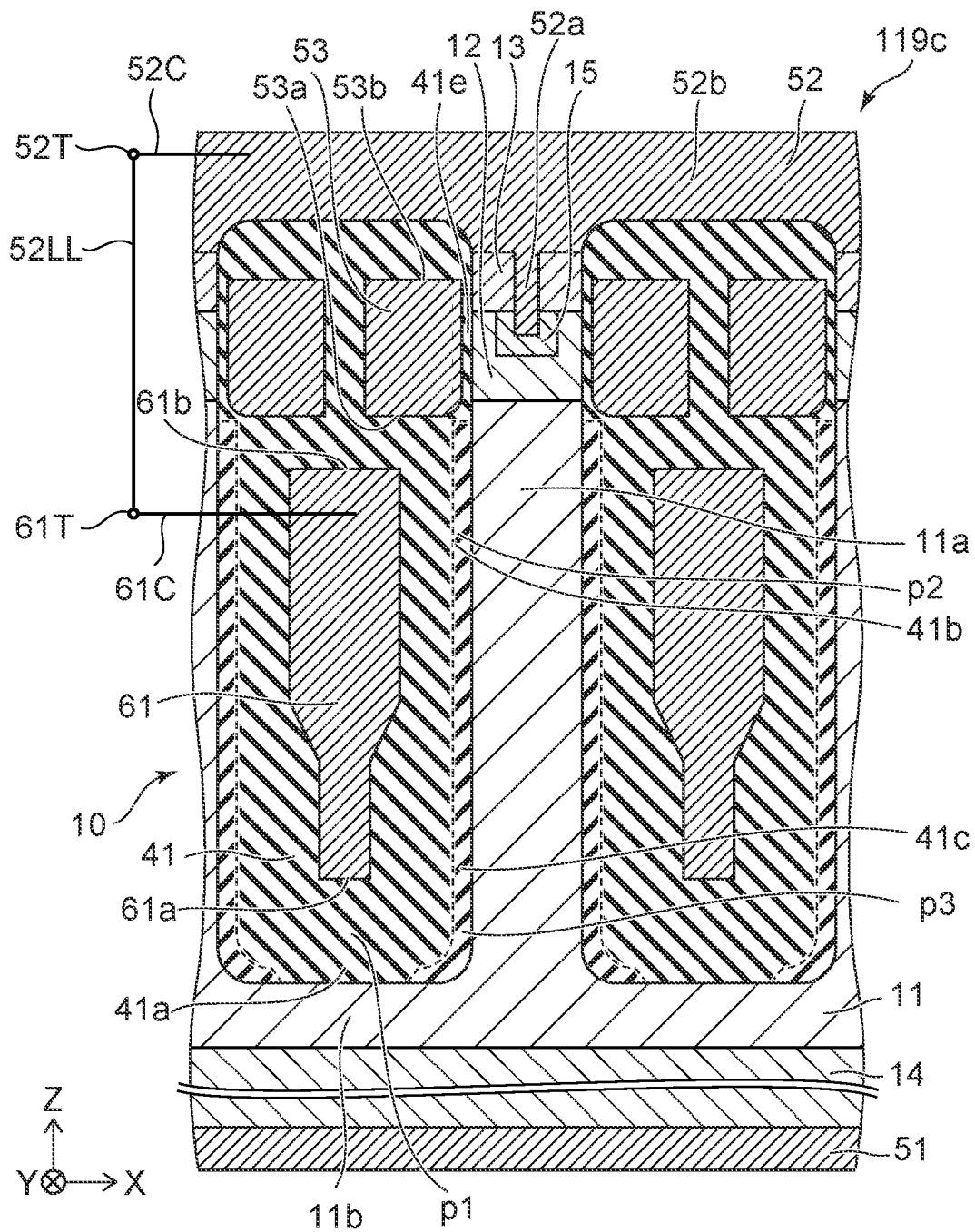
FIG. 4 is a schematic cross-sectional view illustrating a semiconductor device of a reference example.

FIGS. 2 to 4 are schematic cross-sectional views illustrating semiconductor devices of reference examples.

As shown in FIG. 2, in a semiconductor device 119*a* of a first reference example, the third insulation region 41*c* is not provided. The first insulating member 41 does not include the first element at the first to third positions p1 to p3. In the first reference example, the entire first insulating member 41 is SiO$_2$. In the first reference example, it is difficult to obtain a sufficiently high breakdown voltage. Alternatively, when trying to obtain a high breakdown voltage, the on-resistance becomes high.

As shown in FIG. 3, in a semiconductor device 119*b* of a second reference example, the third insulating region 41*c* including the first element is provided. In the second reference example, the first insulating region 41*a* also includes the first element. The first insulating member 41 includes the first element at the first position p1 and the third position p3. In such a second reference example, it was found that it is difficult to obtain a sufficiently high breakdown voltage. Alternatively, when trying to obtain a high breakdown voltage, the on-resistance becomes high.

As shown in FIG. 4, in a semiconductor device 119*c* of a third reference example, the third insulating region 41*c* including the first element is provided. In the third reference example, the second insulating region 41*b* also includes the first element. The first insulating member 41 including the first element at the second position p2 and the third position p3. In such a third reference example, it was found that it is difficult to obtain a sufficiently high breakdown voltage. Alternatively, when trying to obtain a high breakdown voltage, the on-resistance becomes high.

In the embodiment, the concentration of the first element is high in the third insulating region 41*c*, and the concentration of the first element is low in the first insulating region 41*a* and the second insulating region 41*b*. With such a configuration, a high breakdown voltage can be obtained. Hereinafter, an example of the characteristics of the semiconductor device will be described.

Figure 5:
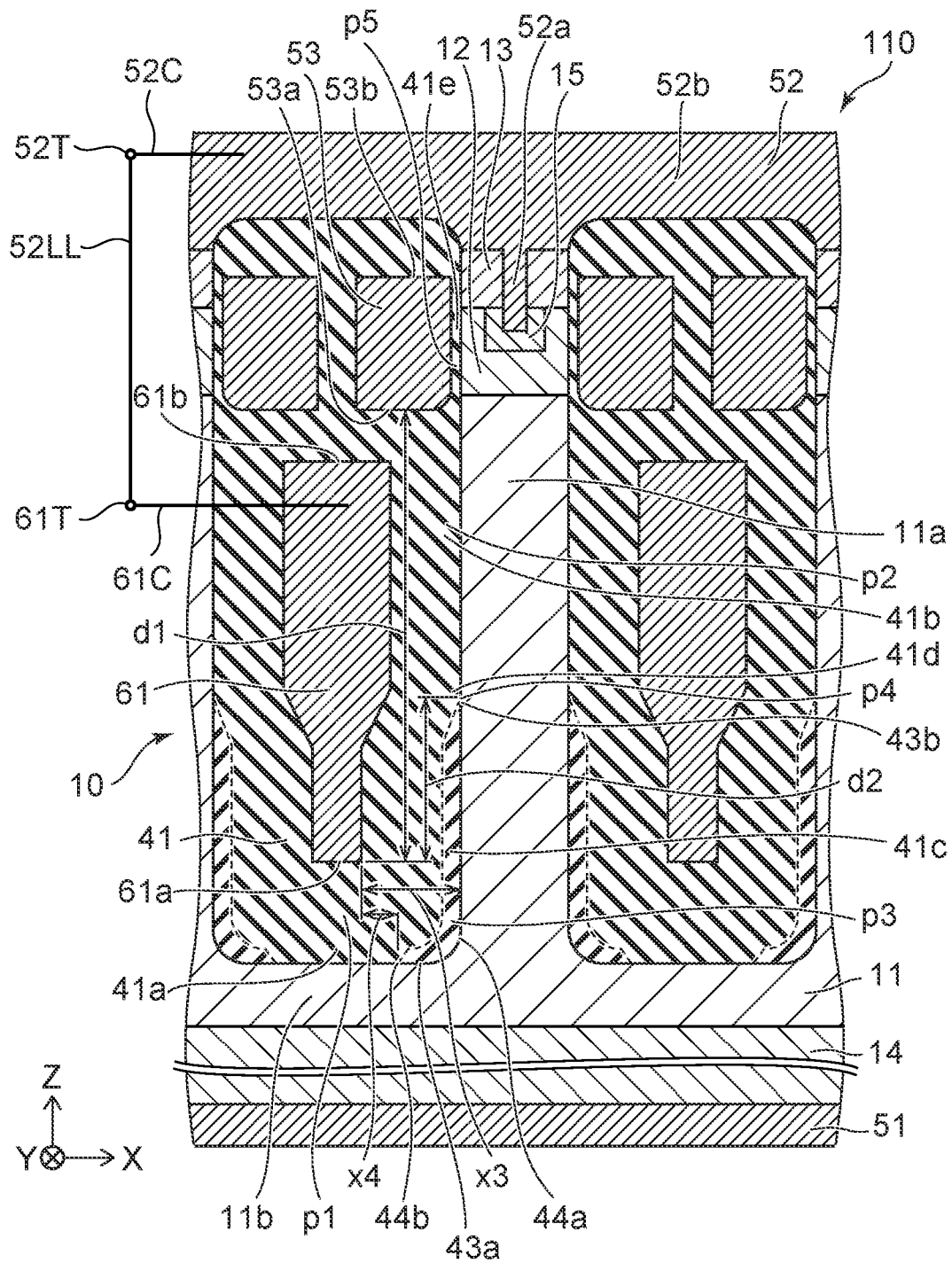
FIG. 5 is a schematic cross-sectional view illustrating the semiconductor device.

FIG. 5 is a schematic cross-sectional view illustrating the semiconductor device.

As shown in FIG. 5, the third insulating region 41*c* includes a first direction end portion 43*a* and a first direction other end portion 43*b*. The first direction end portion 43*a* is located between the second partial region 11*b* and the first direction other end portion 43*b* in the first direction (Z-axis direction). The first direction end portion 43*a* is an end portion on a side of the first electrode 51. The first direction other end portion 43*b* is an end portion on a side of the second electrode 52.

A distance along the first direction between the position of the first conductive member end portion 61*a* in the first direction and the position of the third electrode end portion 53*a* in the first direction is defined as a first distance d1. A distance along the first direction between the position of the first conductive member end portion 61*a* in the first direction (Z-axis direction) and the position of the first direction other end portion 43*b* in the first direction is defined as a second distance d2. The first distance d1 corresponds to a depth of the first conductive member end portion 61*a* with reference to the third electrode end portion 53*a*. The second distance d2 corresponds to, for example, a depth of the upper end of the third insulating region 41*c* with reference to the depth of the first conductive member end portion 61*a*.

A ratio (d2/d1) of the second distance d2 to the first distance d1 is defined as the first ratio. When the first ratio is 0, the depth of the upper end of the third insulating region 41*c* is the same as the depth of the first conductive member end portion 61*a*. When the first ratio is 1, for example, the upper end of the third insulating region 41*c* is in contact with the third electrode 53. This case corresponds to the semiconductor device 119*c* of the third reference example.

As shown in FIG. 5, the third insulating region 41*c* includes a second direction end portion 44*a* and a second direction other end portion 44*b*. The second direction end portion 44*a* is located between the second direction other end portion 44*b* and the first partial region 11*a* in the second direction (for example, the X-axis direction). The second direction end portion 44*a* is an end portion on a side of the first conductive member 61 in the X-axis direction. The second direction other end portion 44*b* is an end on a side of the first partial region 11*a* in the X-axis direction.

A distance (for example, the shortest distance) along the second direction between the position of the first conductive member end portion 61*a* in the second direction (for example, the X-axis direction) and the position of the second direction end portion 44*a* in the second direction is defined as a third distance x3. A distance (for example, the shortest distance) along the second direction between the position of the first conductive member end portion 61*a* in the second direction (for example, the X-axis direction) and the position of the second direction other end portion 44*b* in the second direction is defined as a fourth distance x4. The position of the first conductive member end portion 61*a* in the second direction (for example, the X-axis direction) is the position of the first conductive member end portion 61*a* on a side of the first partial region 11*a* in the X-axis direction.

A ratio of the fourth distance x4 to the third distance x3 (x4/x3) is defined as a second ratio. When the second ratio is 0, the second direction other end portion 44*b* overlaps the first conductive member end portion 61*a* on the side of the first partial region 11*a* in the Z-axis direction. One example when the second ratio is negative corresponds to the semiconductor device 119*b* of the second reference example. When the second ratio is 1, the third insulating region 41*c* is substantially not provided. The condition of the second ratio of 1 corresponds to, for example, the semiconductor device 119*a* of the first reference example.

Hereinafter, examples of the simulation result of the characteristics when the relationship between the first distance d1 and the second distance d2 is changed will be described.

Figure 6:
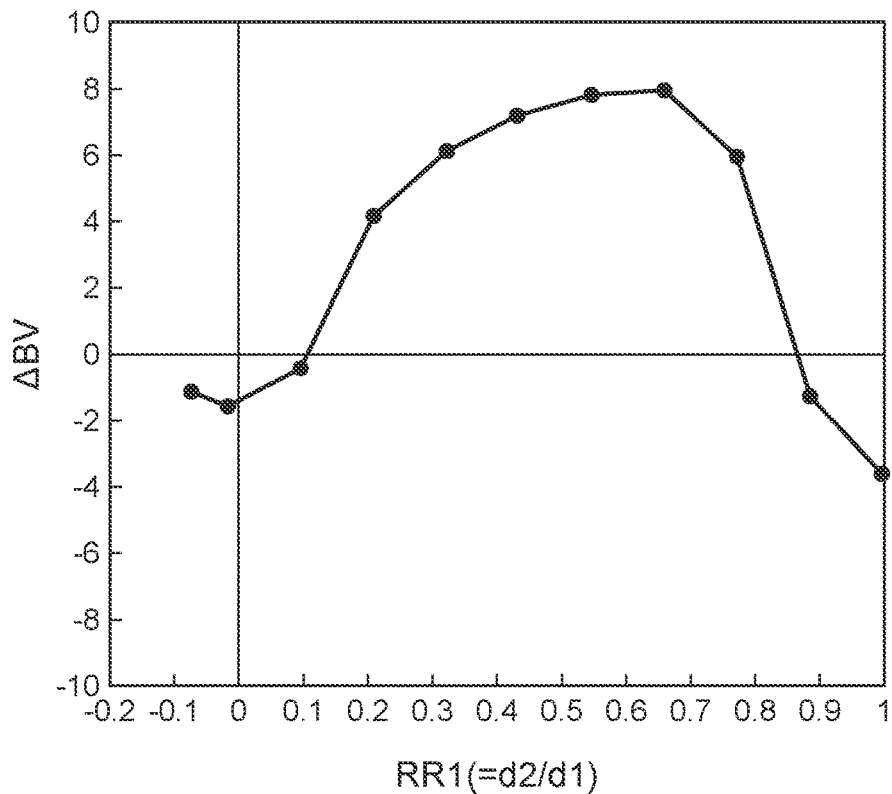
FIG. 6 is a graph illustrating the characteristics of the semiconductor device.

FIG. 6 is a graph illustrating the characteristics of the semiconductor device.

The horizontal axis in FIG. 6 is the first ratio RR1. As described above, the first ratio RR1 is the ratio of the second distance d2 to the first distance d1. The vertical axis of FIG. 6 is the relative blocking voltage ΔBV. The relative blocking voltage ΔBV is the blocking voltage with reference to the blocking voltage in the first reference example described above. In FIG. 6, the second ratio is fixed at 0.8. It is preferable that the relative blocking voltage ΔBV is large.

As shown in FIG. 6, when the first ratio RR1 exceeds 0.1, the relative blocking voltage ΔBV increases. When the first ratio RR1 becomes 0.66 or more, the relative blocking voltage ΔBV begins to decrease. When the first ratio RR1 is not less than 0.15 and not more than 0.85, a high blocking voltage ΔBV can be obtained.

In the embodiment, the first ratio RR1 is preferably not less than 0.15 and not more than 0.85. The first ratio RR1 is more preferably not less than 0.2 and not more than 0.8. A high blocking voltage ΔBV can be stably obtained. The first ratio RR1 may be not less than 0.21 and not more than 0.77. A high blocking voltage ΔBV can be stably obtained.

As shown in FIG. 6, in the semiconductor device 119c of the third reference example in which the first ratio RR1 is 1, the blocking voltage ΔBV is low.

Hereinafter, examples of the simulation result of the characteristics when the relationship between the third distance x3 and the fourth distance x4 is changed will be described.

Figure 7:
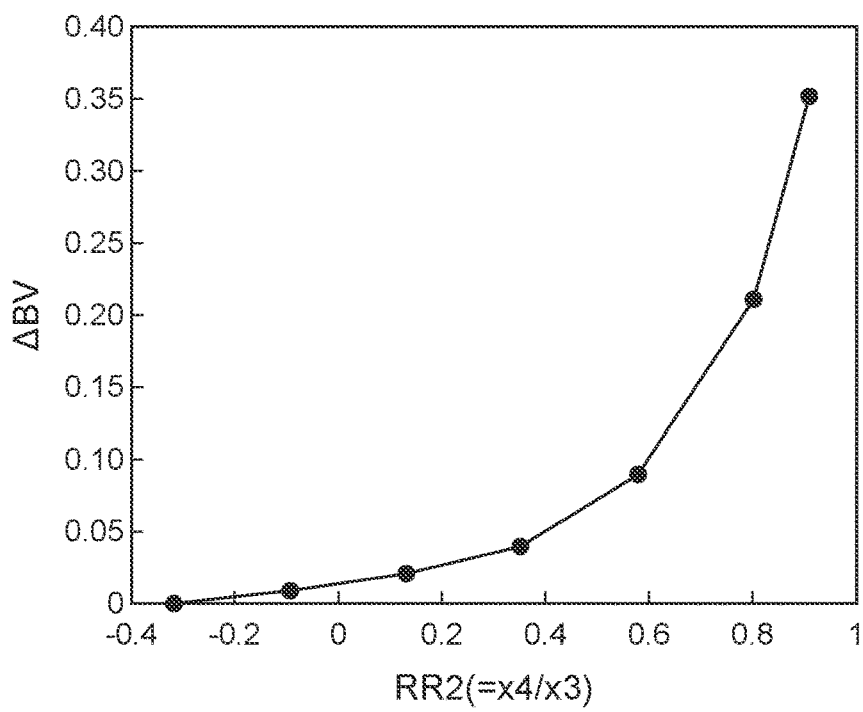
FIG. 7 is a graph illustrating the characteristics of the semiconductor device.

FIG. 7 is a graph illustrating the characteristics of the semiconductor device.

The horizontal axis in FIG. 7 is the second ratio RR2. As described above, the second ratio RR2 is the ratio of the fourth distance x4 to the third distance x3. The vertical axis of FIG. 6 is the relative blocking voltage ΔBV. In FIG. 7, the first ratio RR1 is fixed at 0.435.

As shown in FIG. 7, when the second ratio RR2 is substantially 0 (semiconductor device 119b of the second reference example), the blocking voltage ΔBV is low. As the second ratio RR2 increases, the blocking voltage ΔBV increases.

As will be described above, the condition that the second ratio RR2 is 1 corresponds to the semiconductor device 119a of the first reference example, and in this case, the blocking voltage ΔBV is low. When the second ratio RR2 is higher than 0 and less than 1, a high blocking voltage ΔBV is obtained. Within this range, when the second ratio RR2 rises, the blocking voltage ΔBV rises.

In the embodiment, the second ratio RR2 is preferably, for example, not less than 0.16 and less than 1. The second ratio RR2 may be, for example, not less than 0.16 and not more than 0.9. A high blocking voltage ΔBV is obtained. In the embodiment, the second ratio RR2 may be, for example, not less than 0.36. High blocking voltage ΔBV is stably obtained. The second ratio RR2 may be, for example, not less than 0.58. A higher blocking voltage ΔBV can be stably obtained.

As shown in FIG. 1, in the embodiment, the first insulating member 41 may include a fourth position p4. The position of the fourth position p4 in the first direction (Z-axis direction) is located between the position of the third position p3 in the first direction and the position of the second position p2 in the first direction. The concentration of the first element at the fourth position p4 is, for example, between the concentration of the first element at the third position p3 and the concentration of the first element at the second position p2. In this way, a region in which the concentration of the first element is intermediate may be provided.

For example, the first insulating member 41 may include a fourth insulating region 41d. The position of the fourth insulating region 41d in the first direction (Z-axis direction) is located between the position of the third insulating region 41c in the first direction and the position of the second insulating region 41b in the first direction. The concentration of the first element in the fourth insulating region 41d is between the concentration of the first element in the third insulating region 41c and the concentration of the first element in the second insulating region 41b.

As shown in FIG. 1, the first insulating member 41 may include a fifth position p5. The fifth position p5 is located between the third electrode 53 and the second semiconductor region 12 in the second direction (X-axis direction). The first insulating member 41 does not include the first element at the fifth position p5. Alternatively, the concentration of the first element at the fifth position p5 is lower than the concentration of the first element at the third position p3.

For example, the first insulating member 41 includes a fifth insulating region 41e. The fifth insulating region 41e is located between the third electrode 53 and the second semiconductor region 12 in the second direction (X-axis direction). The fifth insulating region 41e does not include the first element. Alternatively, the concentration of the first element in the fifth insulating region 41e is lower than the concentration of the first element in the third insulating region 41c.

The fifth insulating region 41e functions as, for example, a gate insulating film. A stable threshold voltage can be obtained because the fifth insulating region 41e (fifth position p5) does not include the first element or the concentration of the first element in the fifth insulating region 41e is low.

As shown in FIG. 1, in the semiconductor device 110, the first insulating member 41 includes a sixth position p6. The position of the sixth position p6 in the second direction (X-axis direction) is located between the position of the first conductive member 61 (for example, the first conductive member end portion 61a) in the second direction and the position of the third position p3 in the second direction. The first insulating member 41 does not include the first element at the sixth position p6. Alternatively, the concentration of the first element at the sixth position p6 is lower than the concentration of the first element at the third position p3.

For example, the first insulating member 41 includes a sixth insulating region 41f. The position of the sixth insulating region 41f in the second direction (X-axis direction) is located between the position of the first conductive member 61 (for example, the first conductive member end portion 61a) in the second direction and the position of the third insulating region 41c in the second direction. The sixth insulating region 41f does not include the first element. Alternatively, the concentration of the first element in the sixth insulating region 41f is lower than the concentration of the first element in the third insulating region 41c. By providing such a sixth insulating region 41f, it is easy to obtain a higher breakdown voltage.

Figure 8:
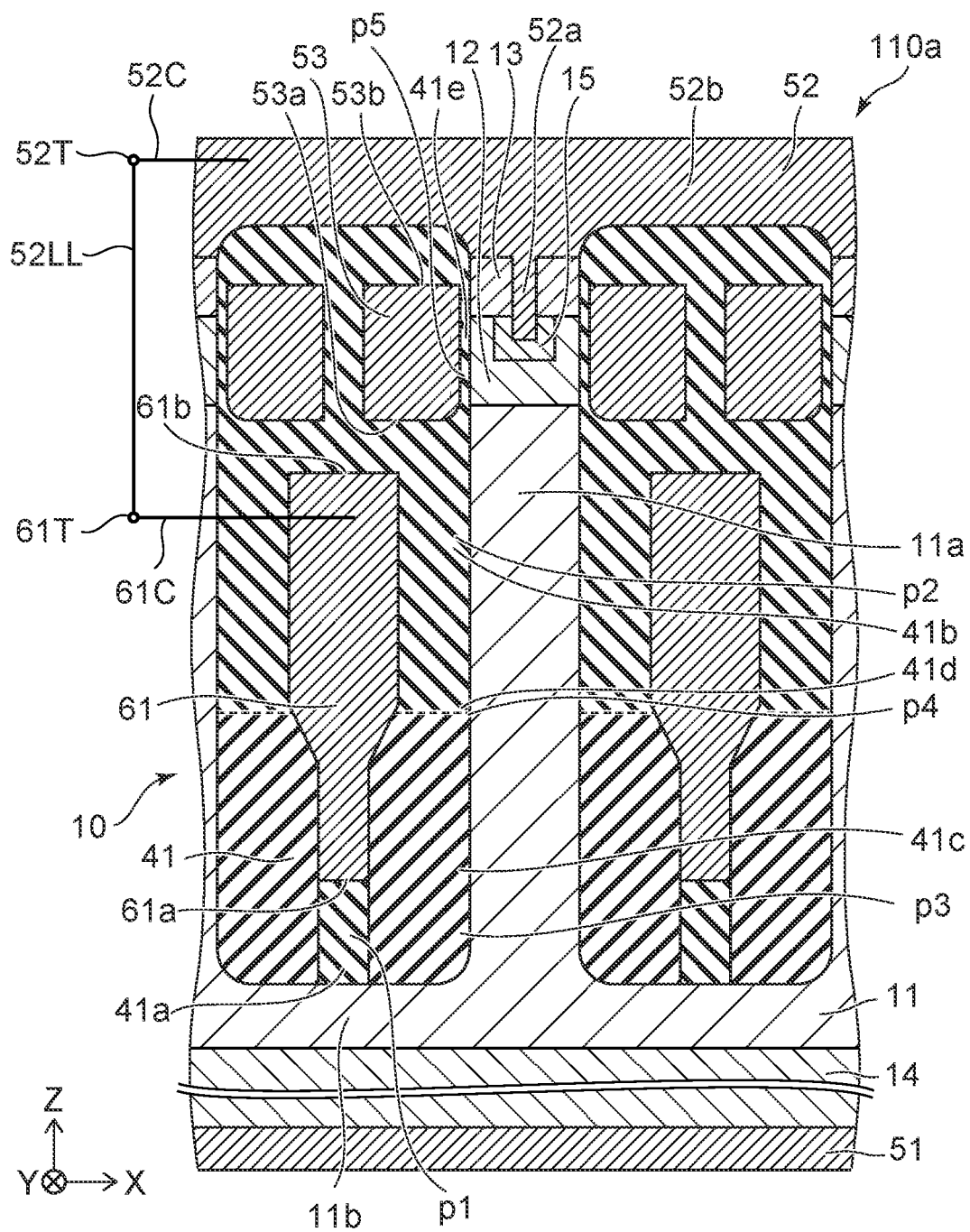
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, also in a semiconductor device 110a according to the embodiment, the first insulating member 41 includes the first to fifth insulating regions 41a to 41e. In the semiconductor device 110a, the sixth insulating region 41f is not provided. Other configurations of the semiconductor device 110a may be the same as those of the semiconductor device 110. High breakdown voltage can also be obtained in the semiconductor device 110a.

In the embodiment, the concentration of the first element in the first insulating member 41 in the plane along the X-Y plane including the first conductive member end portion 61a is, for example, not less than $1.5 \times 10^{14}$ cm$^{-2}$ and not more than $1.05 \times 10^{15}$ cm$^{-2}$. This makes it easy to obtain a high breakdown voltage and a low on-resistance.

Figure 9:
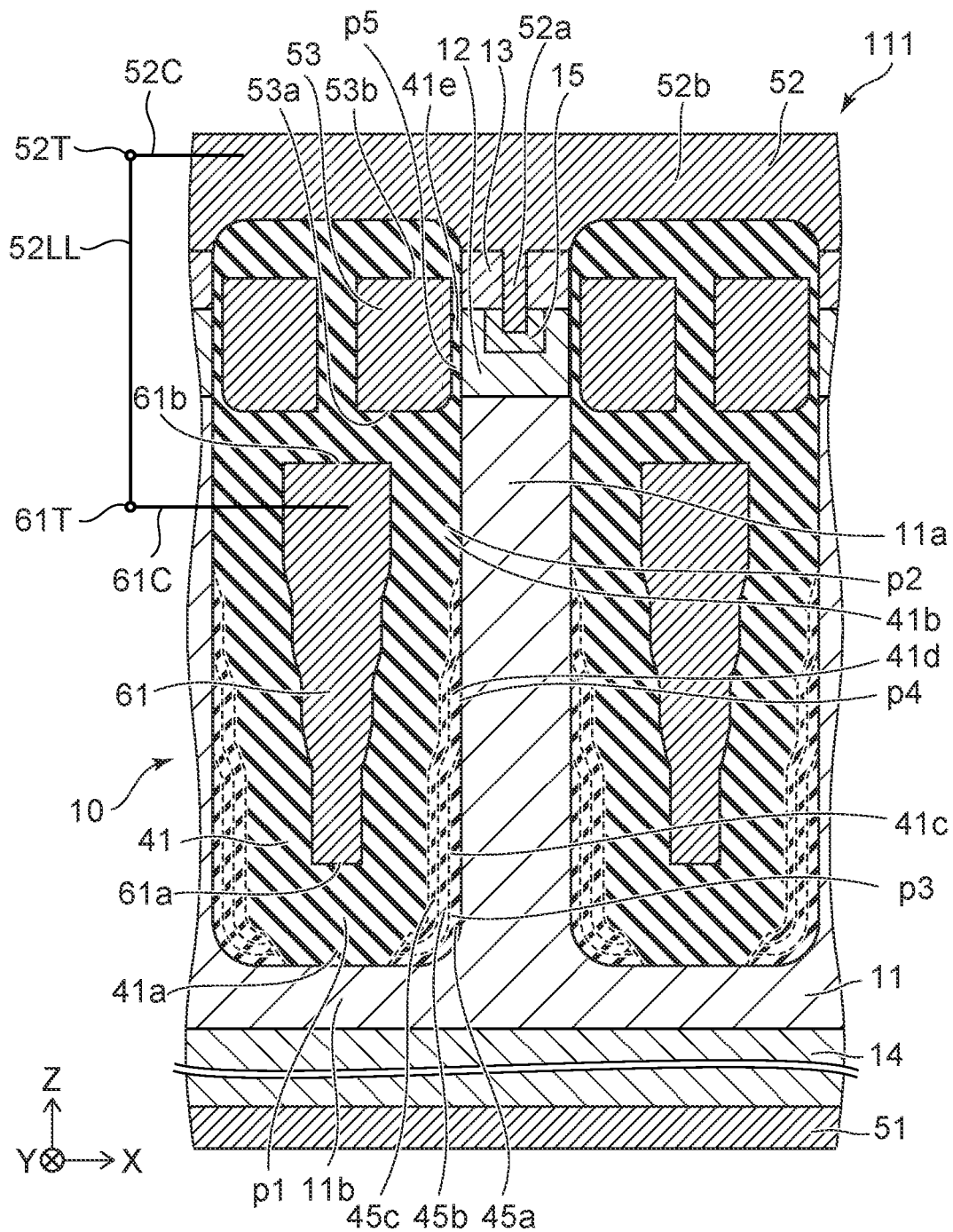
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, in a semiconductor device 111 according to the embodiment, the first insulating member 41 includes the first to fifth insulating regions 41a to 41e. In the semiconductor device 111, the third insulating region 41c includes a plurality of regions. In this example, the plurality of regions includes, for example, a first region 45a, a second region 45b, and a third region 45c. The number of the plurality of regions may be not less than 2. Other configurations of the semiconductor device 111 may be the same as those of the semiconductor device 110.

Figure 10:
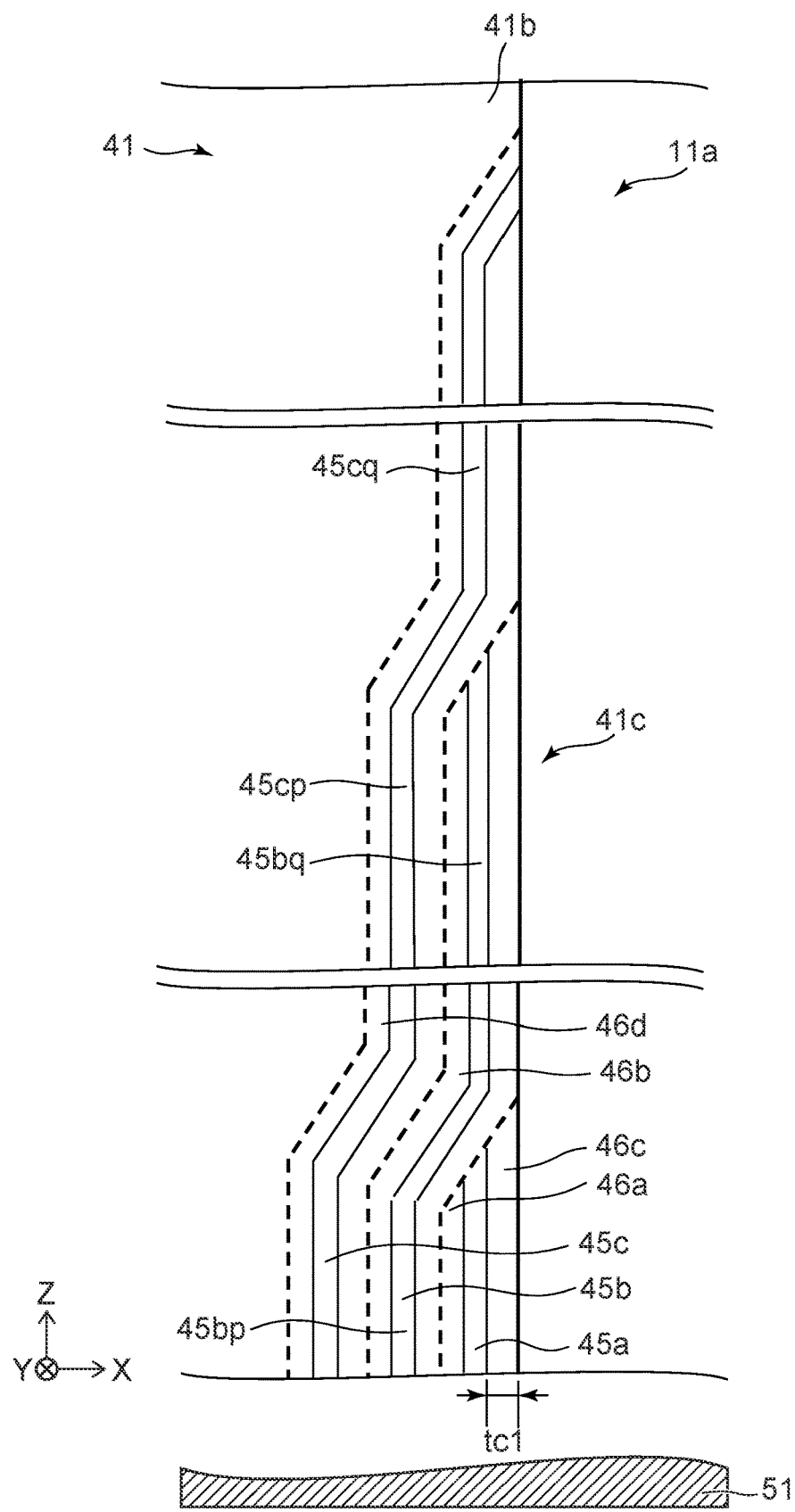
FIG. 10 is a schematic cross-sectional view illustrating a part of the semiconductor device according to the first embodiment.

FIG. 10 is a schematic cross-sectional view illustrating a part of the semiconductor device according to the first embodiment.

FIG. 10 illustrates the third insulating region 41c of the first insulating member 41. As shown in FIG. 1, the third insulating region 41c includes a first region 45a, a second region 45b, and a first intermediate region 46a. The first region 45a and the second region 45b include the first element. The first intermediate region 46a is provided between the first region 45a and the second region 45b. The first region 45a is, for example, between a part 45bp of the second region 45b and the first partial region 11a in the second direction (X-axis direction).

The first intermediate region 46a does not include the first element. Alternatively, the concentration of the first element in the first intermediate region 46a is lower than the concentration of the first element in the first region 45a and lower than the concentration of the first element in the second region 45b.

For example, the first region 45a and the second region 45b include SiON. The first intermediate region 46a includes SiO$_2$. The first region 45a and the second region 45b are, for example, stacked films stacked via the first intermediate region 46a.

High breakdown voltage can be obtained also in the semiconductor device 111. When the third insulating region 41c includes the plurality of regions including the first element, the concentration of the first element in the third insulating region 41c may be an average concentration of the first element in a region including the first region 45a, the second region 45b, and the first intermediate region 46a. For example, a ratio of a first sum of a first product and a second product to a second sum of thicknesses of regions including the first element and regions not including the first element may be taken as the average concentration. The first product is a product of the thicknesses of the regions including the first element and the concentration of the first element in the regions including the first element. The second product is a product of the thicknesses of the regions not including the first element and the concentration of the first element in the regions not including the first element.

Such a structure shown in FIG. 10 is obtained by sequentially stacking a film serving as the first region 45a, a film serving as the first intermediate region 46b, and a film serving as the second region 45b.

As shown in FIG. 10, the first region 45a is located between the first electrode 51 and an other portion 45bq of the second region 45b in the first direction (Z-axis direction). The first region 45a and the above-mentioned part 45bp of the second region 45b extend along the first direction (Z-axis direction). The other portion 45bq of the second region 45b is located between a part 45cp of the third region 45c and the first partial region 11a in the second direction (X-axis direction).

As shown in FIG. 10, the third insulating region 41c may further include a third region 45c and a second intermediate region 46b. The third region 45c includes the first element. The second intermediate region 46b is provided between the second region 45b and the third region 45c. The second region 45b is located between a part 45cp of the third region 45c and the first partial region 11a in the second direction (X-axis direction).

The second intermediate region 46b does not include the first element. Alternatively, the concentration of the first element in the second intermediate region 46b is lower than the concentration of the first element in the second region 45b and lower than the concentration of the first element in the third region 45c. As described above, the number of the plurality of regions (plurality of films) including the first element may be 3 or more.

When the third insulating region 41c includes the above-mentioned plurality of regions including the first element, for example, the concentration of the first element in the third insulating region 41c may be an average concentration of the first element in the region including the first region 45a, the second region 45b, the third region 45c, the first intermediate region 46a and the second intermediate region 46b.

As shown in FIG. 10, the other portion 45bq of the second region 45b is located between the first electrode 51 and an other portion 45cq of the third region 45c in the first direction (Z-axis direction). The other portion 45bq of the second region 45b and the other portion 45cq of the third region 45c extend along the first direction (Z-axis direction).

Figure 11:
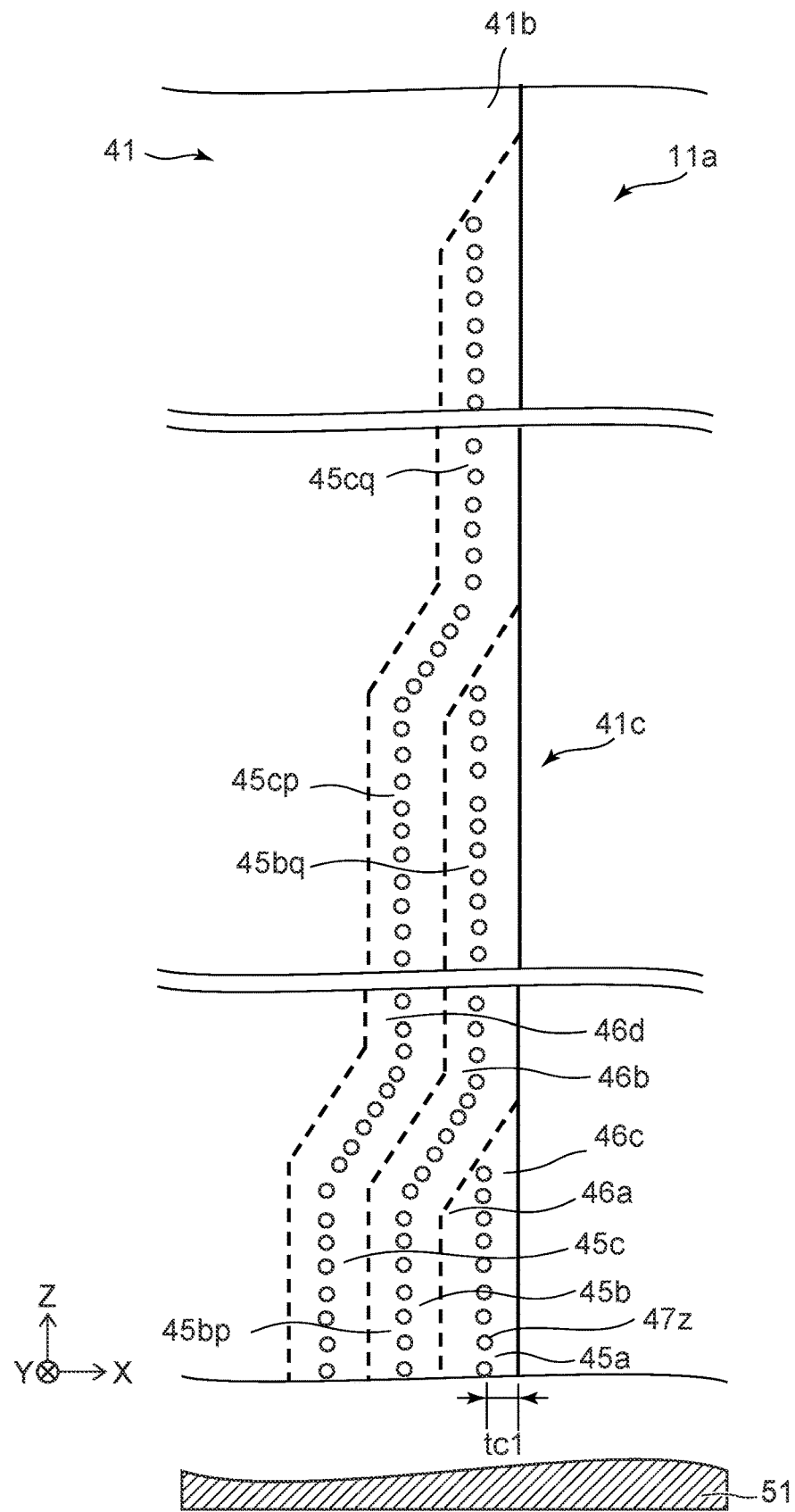
FIG. 11 is a schematic cross-sectional view illustrating the part of the semiconductor device according to the first embodiment.

FIG. 11 is a schematic cross-sectional view illustrating a part of the semiconductor device according to the first embodiment.

As shown in FIG. 11, the third insulating region 41c includes a plurality of stacked regions (first region 45a, second region 45b, third region 45c, first intermediate region 46a, second intermediate region 46b, etc.). Also in this example, at least one of the first region 45a, the second region 45b, or the third region 45c includes a plurality of regions 47z being granular. The plurality of regions 47z are separated from each other along the first direction (Z-axis direction). The plurality of regions 47z include the first element. In this case, the first element includes, for example, at least one selected from the group consisting of aluminum, hafnium and zirconium. When the first element includes such a metal element, a plurality of regions 47z being separated from each other are likely to be formed. When such a plurality of regions 47z are provided, a high breakdown voltage can be also obtained.

As shown in FIGS. 10 and 11, the first insulating member 41 may include a third intermediate region 46c. The third intermediate region 46c is provided between the first region 45a and the first partial region 11a in the second direction. For example, the third intermediate region 46c does not include the first element. Alternatively, the concentration of the first element in the third intermediate region 46c is lower than the concentration of the first element in the first region 45a.

The distance along the second direction (X-axis direction) between the first region 45a and the first partial region 11a corresponds to the thickness ct1 along the second direction (X-axis direction) of the third intermediate region 46c. The thickness tc1 is preferably not more than 10 μnm, for example. For example, the interface energy level in the region between the first region 45a and the first partial region 11b can be suppressed. High breakdown voltage can be obtained stably. The third intermediate region 46c may be provided in the semiconductor device 110 or the semiconductor device 110a.

As described above, the first insulating member 41 may include the first insulating region 41a, the second insulating region 41b, and the third insulating region 41c. The third insulating region 41c includes the first region 45a including the first element (an element including at least one selected from the group consisting of nitrogen, aluminum, hafnium and zirconium) and the second region 45b including the first element, and the first intermediate region 46a provided between the first region 45a and the second region 45b. The first intermediate region 46a does not include the first element. Alternatively, the concentration of the first element in the first intermediate region 46a is lower than the concentration of the first element in the first region 45a and lower than the concentration of the first element in the second region 45b.

The first insulating region 41a and the second insulating region 41b do not include the first element. Alternatively, each of the concentration of the first element in the first insulating region 41a and the concentration of the first element in the second insulating region 41b is lower than the concentration of the first element in the first region 45a and lower than the concentration of the first element in the second region 45b.

As described above, the first region 45a may be located between the first electrode 51 and the other portion 45bq of the second region 45b in the first direction (Z-axis direction). The first region 45a and the part 45bp of the second region 45b extend along the first direction (Z-axis direction). The first region 45a may include the plurality of regions 47z including first element separated from each other in the first direction (Z-axis direction). The third insulating region 41c may include the third region 45c and the second intermediate region 46b.

Figure 12:
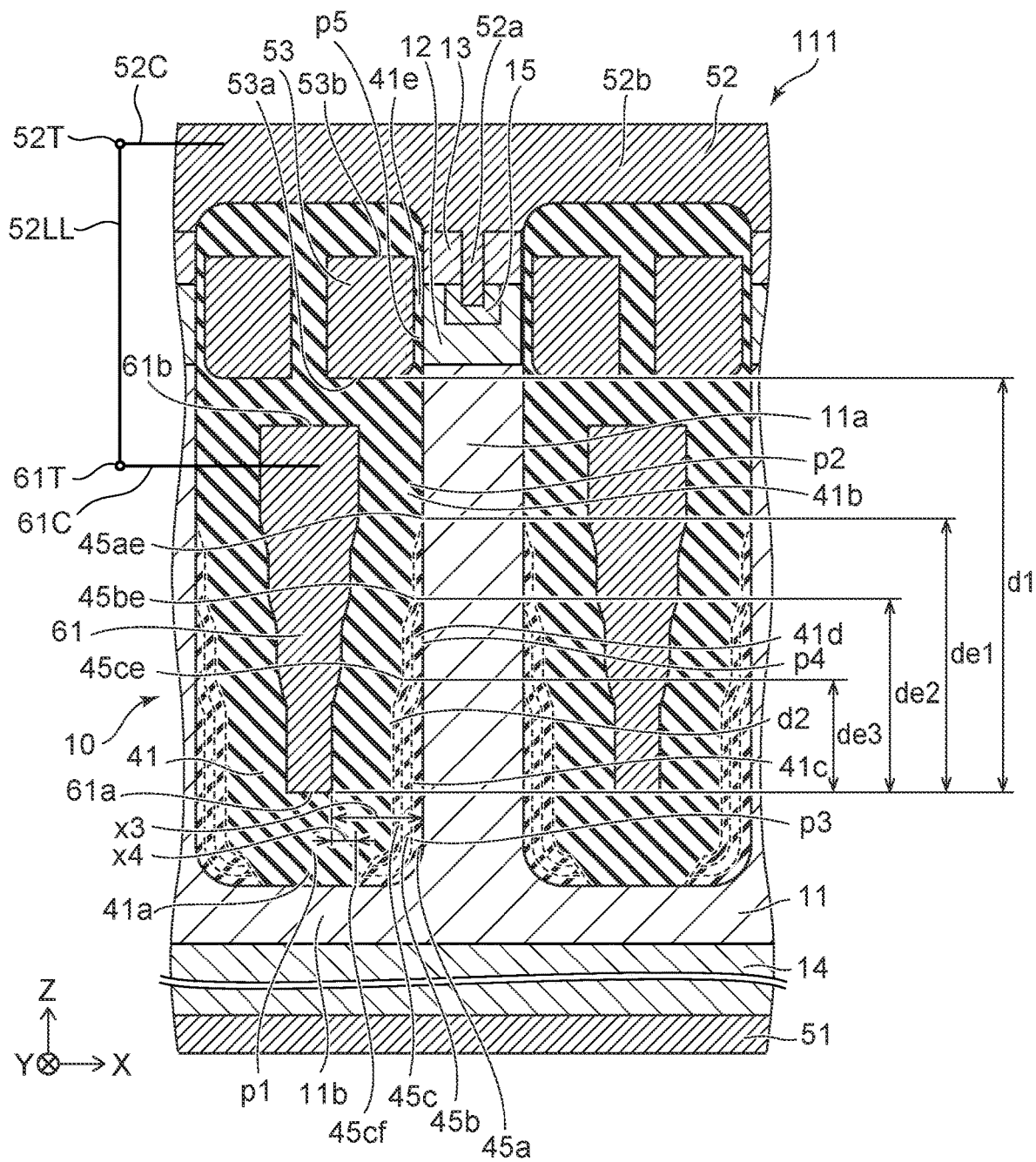
FIG. 12 is a schematic cross-sectional view illustrating the semiconductor device.

FIG. 12 is a schematic cross-sectional view illustrating the semiconductor device.

As shown in FIG. 12, the first to third regions 45a to 45c include first to third region end portions 45ae to 45ce. The first region end portion 45ae is an end portion of the first region 45a on a side of the third electrode 53. The second region end portion 45be is an end portion of the second region 45b on the side of the third electrode 53. The third region end portion 45ce is an end portion of the third region 45c on the side of the third electrode 53.

A distance along the first direction between the position of the first conductive member end portion 61a in the first direction and the position of the third electrode end portion 53a in the first direction is defined as the first distance d1. A distance along the first direction between the position of the first conductive member end portion 61a in the first direction (Z-axis direction) and the position of the first region end portion 45ae in the first direction is defined as a first end distance de1. A distance along the first direction between the position of the first conductive member end portion 61a in the first direction (Z-axis direction) and the position of the second region end portion 45be in the first direction is defined as a second end distance de2. A distance along the first direction between the position of the first conductive member end portion 61a in the first direction (Z-axis direction) and the position of the third region end portion 45ce in the first direction is defined as a third end distance de3.

Hereinafter, examples of the simulation result of the characteristics when the first to third end distances de1 to de3 are changed will be described.

Figure 13A:
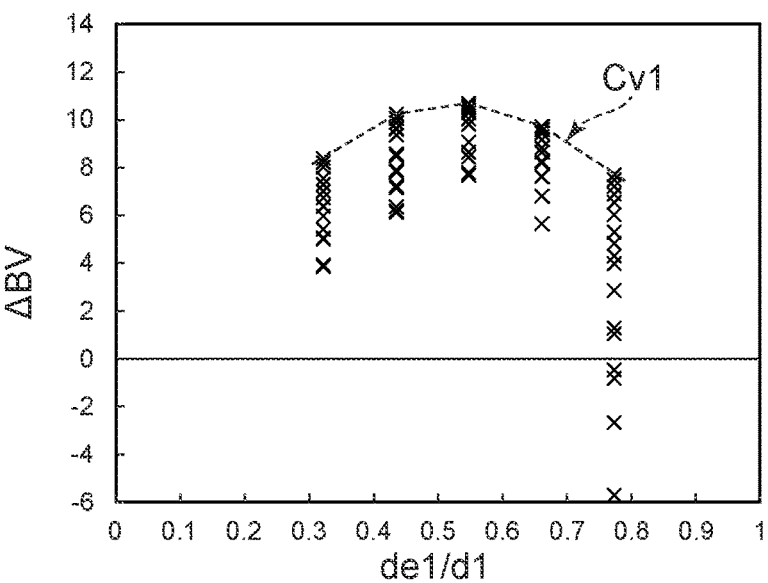
FIGS. 13A to 13C are graphs illustrating the characteristics of the semiconductor device.
Figure 13B:
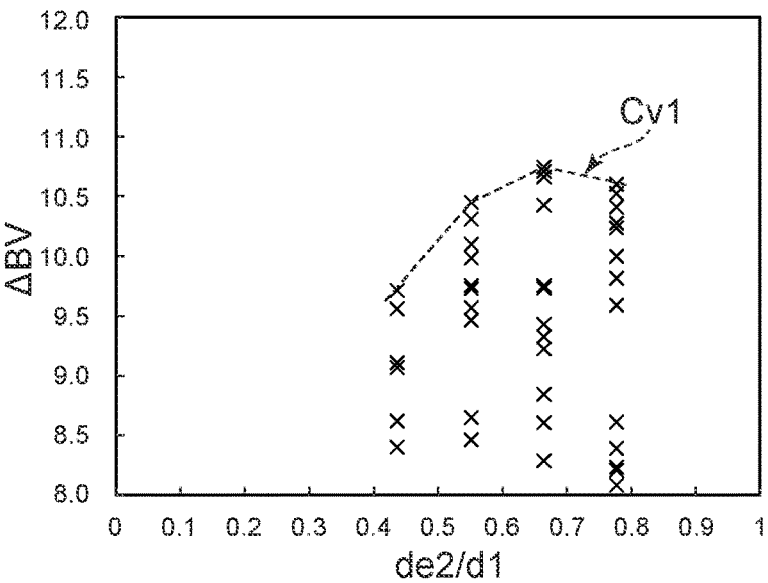
Figure 13C:
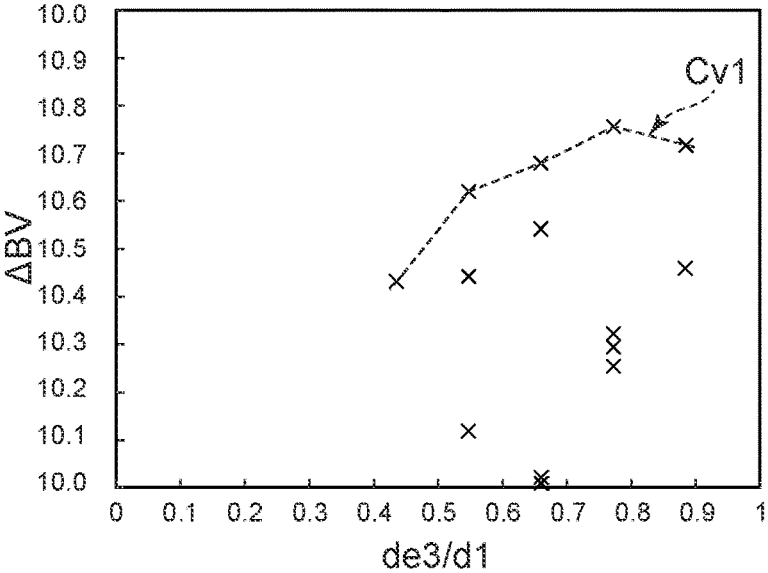

FIGS. 13A to 13C are graphs illustrating the characteristics of the semiconductor device.

Each horizontal axis of FIGS. 13A to 13C corresponds to the ratio de1/d1, the ratio de2/d1, and the ratio de3/d1. The vertical axis of these figures is the relative blocking voltage ΔBV. It is preferable that the relative blocking voltage ΔBV is large. In these figures, all values changed with the ratio of de1/d1 of 0.33 to 0.77, the ratio of de2/d1 of 0.44 to 77, and the ratio of de3/d1 of 0.44 to 0.88 are shown. The curve Cv1 shown in these figures corresponds to the maximum value of the relative blocking voltage ΔBV obtained when the above ratio is changed. In these figures, the fixed charge density in the lateral direction of the trench is $9 \times 10^{14}$ cm$^{-2}$.

As shown in FIG. 13A, when the ratio de1/d1 is not less than 0.4 and not more than 0.7, a large relative blocking voltage ΔBV can be stably obtained. When the ratio de1/d1 is not less than 0.5, a large relative blocking voltage ΔBV can be stably obtained.

As shown in FIG. 13B, when the ratio de2/d1 is not less than 0.55 and not more than 0.8, a large relative blocking voltage ΔBV can be obtained. When the ratio de2/d1 is not less than 0.6 and not more than 0.7, a large relative blocking voltage ΔBV can be stably obtained.

As shown in FIG. 13C, when the ratio de3/d1 is not less than 0.55 and not more than 0.9, a large relative blocking voltage ΔBV can be obtained. When the ratio de3/d1 is not less than 0.7 and not more than 0.8, a large relative blocking voltage ΔBV can be stably obtained.

As shown in FIG. 12, the positions of the ends of the first to third regions 45a to 45c in the second direction do not change significantly. Therefore, practically, the position of the end portion in each of the first to third regions 45a to 45c in the second direction may be the position of the end portion 45cf in the second direction of the third region 45c. A distance (for example, the shortest distance) along the second direction between the position of the first conductive member end portion 61a in the second direction (for example, the X-axis direction) and the position of the second direction end portion 44a in the second direction is the third distance x3. A distance (for example, the shortest distance) along the second direction (for example) between the position of the first conductive member end portion 61a in the second direction (for example, the X-axis direction) and the position of the second direction end portion 45cf of the other end portion 44b in the second direction is the fourth distance x4. The position of the first conductive member end portion 61a in the second direction (for example, the X-axis direction) is the position of the first conductive member end portion 61a on the side of the first partial region 11a in the X-axis direction.

Figure 14:
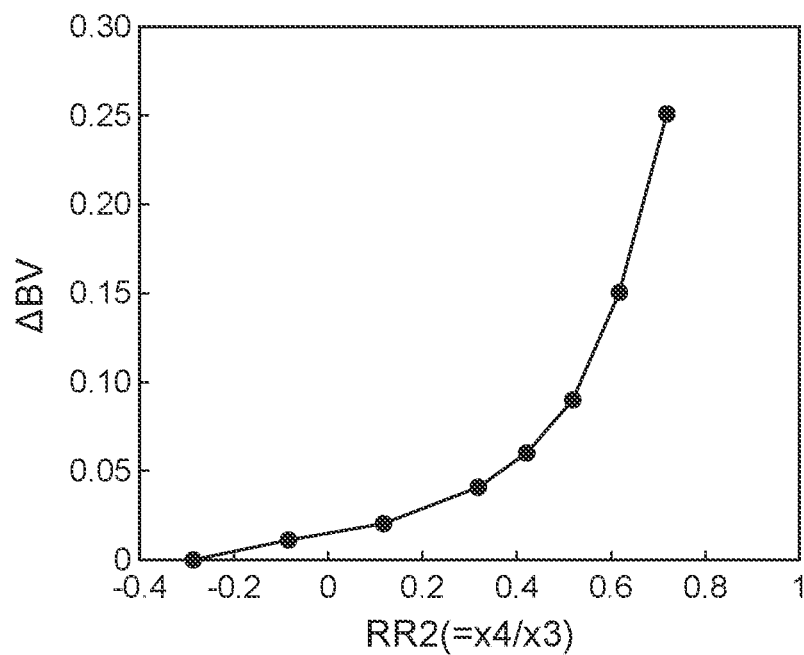
FIG. 14 is a graph illustrating the characteristics of the semiconductor device.

FIG. 14 is a graph illustrating the characteristics of the semiconductor device.

FIG. 14 illustrates the characteristics of the semiconductor device 111 including the first to third regions 45a to 45c. The horizontal axis of FIG. 14 is the second ratio RR2. The second ratio RR2 is the ratio of the fourth distance x4 to the third distance x3. The vertical axis of FIG. 14 is the relative blocking voltage ΔBV.

As shown in FIG. 14, in the semiconductor device 111, the second ratio RR2 is preferably not less than 0.16 and less than 1, for example. The second ratio RR2 may be, for example, not less than 0.16 and not more than 0.7. A high blocking voltage ΔBV is obtained. In the embodiment, the second ratio RR2 may be, for example, 0.36 or more. The second ratio RR2 may be, for example, 0.58 or more.

Figure 15:
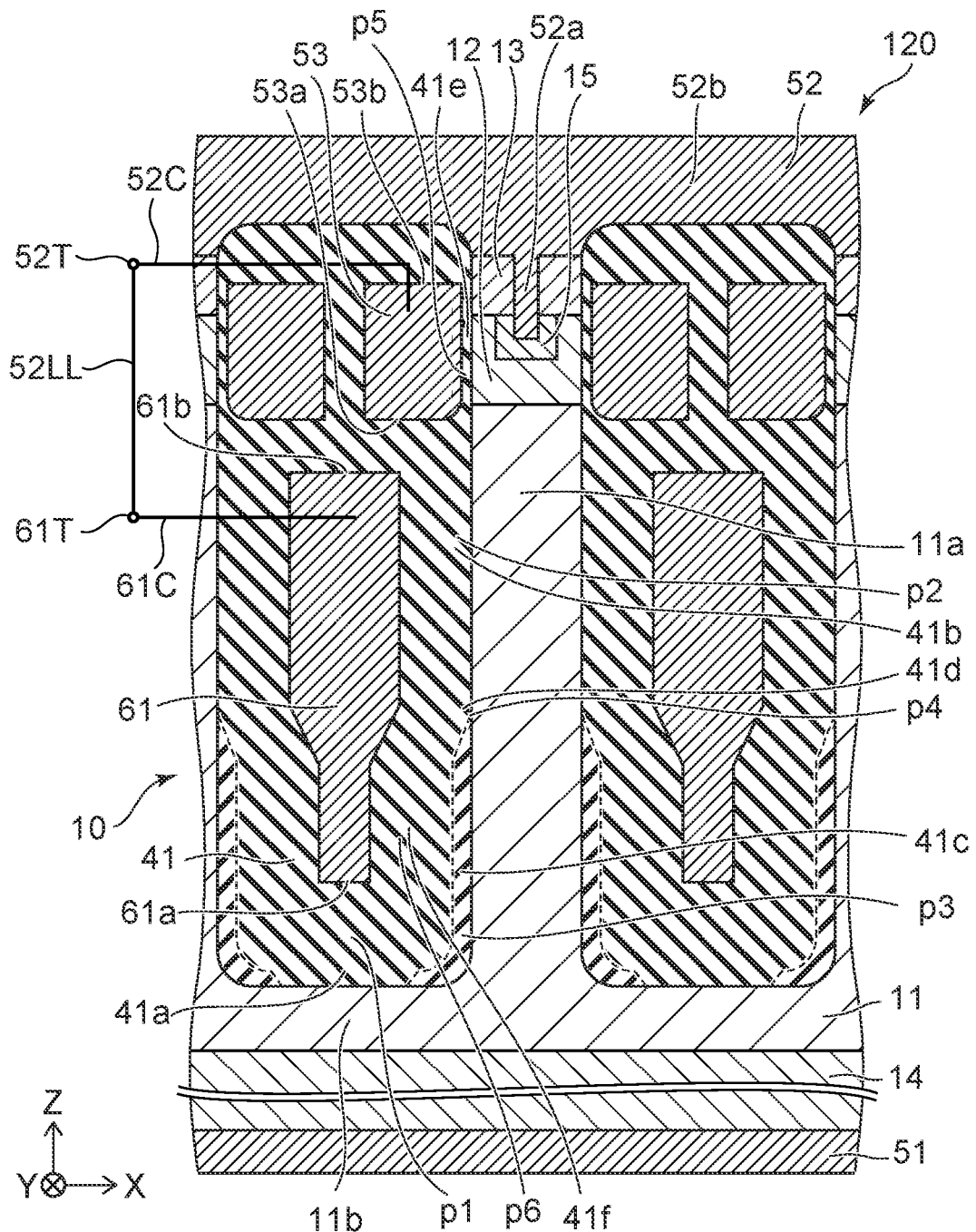
FIG. 15 is a schematic cross-sectional view illustrating a semiconductor device according to the first embodiment.

FIG. 15 is a schematic cross-sectional view illustrating a semiconductor device according to the first embodiment.

As shown in FIG. 15, in a semiconductor device 120 according to the embodiment, the first conductive member 61 is electrically connected with the third electrode 53. Alternatively, the first conductive member 61 is configured to be electrically connected with the third electrode 53. Other configurations of the semiconductor device 120 may be the same as those of the semiconductor device 110, 110a or 111, for example.

For example, as shown in FIG. 15, the first conductive member 61 is electrically connected with the third electrode 53 via the connecting member 61C, the connecting member 52LL, and the connecting member 52C. These connecting members may be provided at positions different from the cross section illustrated in FIG. 15. For example, the terminal 52T may be connected with the third electrode 53 via the connecting member 52C. The terminal 61T may be electrically connected with the first conductive member 61 via the connecting member 61C. The terminal 61T may be electrically connected with the terminal 52T by the connecting member 52LL. The connecting member 52LL may be provided separately from the semiconductor device 120. Also in the semiconductor device 120, for example, a high breakdown voltage can be obtained.

Figure 16:
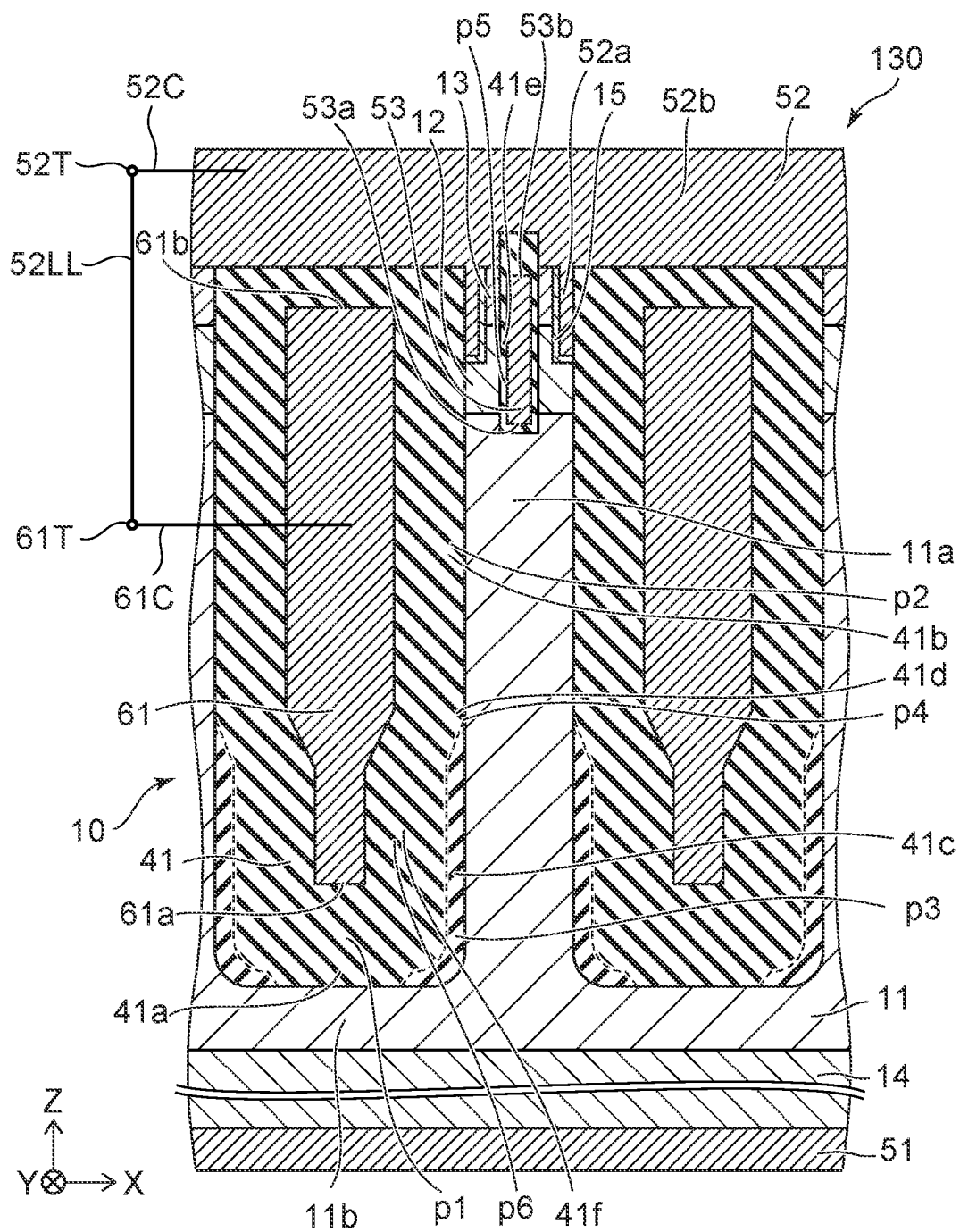
FIG. 16 is a schematic cross-sectional view illustrating the semiconductor device according to the first embodiment.

FIG. 16 is a schematic cross-sectional view illustrating a semiconductor device according to the first embodiment.

As shown in FIG. 16, in a semiconductor device 130 according to the embodiment, a part of the first conductive member 61 overlaps the third electrode 53 in the second direction (X-axis direction). Other configurations of the semiconductor device 120 may be the same as those of the semiconductor devices 110, 110a, 111 or 120, for example. Also in the semiconductor device 120, for example, a high breakdown voltage can be obtained.

Second Embodiment

The second embodiment relates to a method for manufacturing a semiconductor device.

FIGS. 17 to 23 are schematic cross-sectional views in order of processes illustrating a manufacturing method of a semiconductor device according to the second embodiment.

Figure 17:
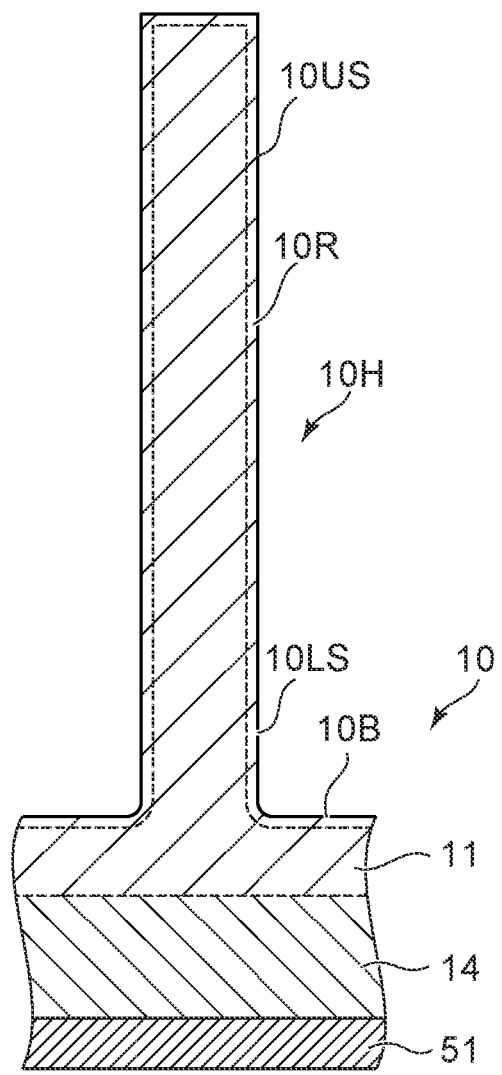
FIG. 17 is a schematic cross-sectional view in the order of process illustrating a method for manufacturing a semiconductor device according to a second embodiment.

As shown in FIG. 17, the semiconductor member 10 is prepared. The semiconductor member 10 includes a hole 10H. The hole 10H may be, for example, a trench. The hole 10H includes a bottom surface 10B, a lower side surface 10LS and an upper side surface 10US. The distance between the lower side surface 10LS and the bottom surface 10B is shorter than the distance between the upper side surface 10US and the bottom surface 10B. Such a hole can be formed, for example, by removing a part of the semiconductor layer to be the semiconductor member 10. Partial removal can be performed, for example, by etching with a mask.

The depth of the hole 10H (length along the Z-axis direction) is, for example, not less than 2 μm and not more than 10 μm. The bottom surface of the hole 10H is in the first semiconductor region 11.

If necessary, an oxidized region 10R may be formed on the surface of the formed hole 10H. The oxidation region 10R may be formed by, for example, a thermal oxidation treatment. The thickness of the oxidation region 10R may be, for example, not less than 200 nm and not more than 1000 nm. In one example, the thickness of the oxidized region 10R may be substantially the same as the thickness tc1 (see FIGS. 10 and 11).

Figure 18:
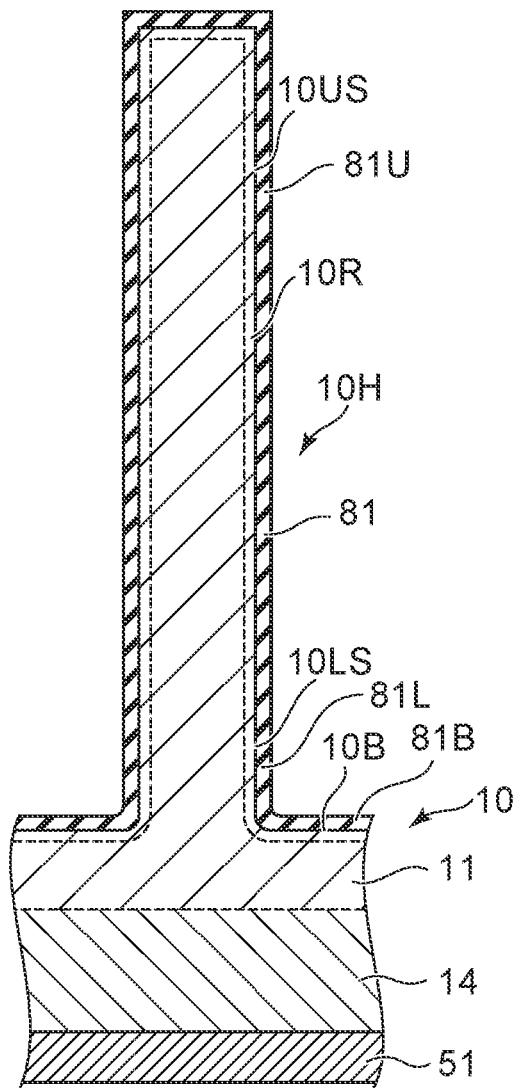
FIG. 18 is a schematic cross-sectional view in the order of process illustrating the method for manufacturing the semiconductor device according to the second embodiment.

As shown in FIG. 18, a first film 81 is formed on the bottom surface 10B, the lower side surface 10LS, and the upper side surface 10US of the hole 10H of the semiconductor member 10. The first film 81 includes the first element. The first element includes at least one selected from the group consisting of nitrogen, aluminum, hafnium and zirconium. The first film 81 includes a first bottom surface region 81B provided on the bottom surface 10B, a first lower side surface region 81L provided on the lower side surface 10LS, and a first upper side surface region 81U provided on the upper side surface 10US.

Figure 19:
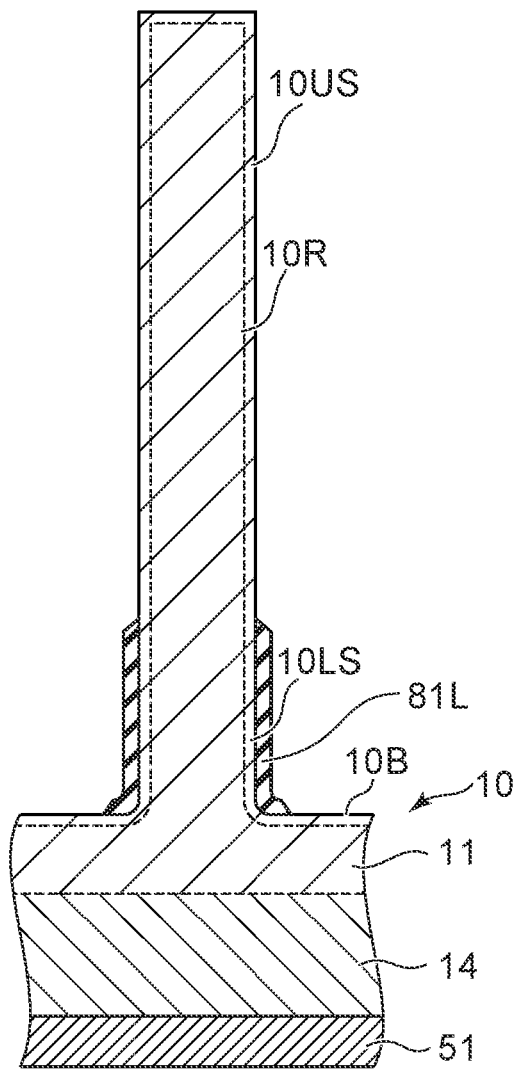
FIG. 19 is a schematic cross-sectional view in the order of process illustrating the method for manufacturing the semiconductor device according to the second embodiment.

As shown in FIG. 19, the first bottom surface region 81B and the first upper side surface region 81U are removed while leaving the first lower side surface region 81L. The removal can be performed by etching using a mask (for example, dry etching). As a result, the bottom surface 10B and the upper side surface 10US of the hole 10H are exposed.

Figure 20:
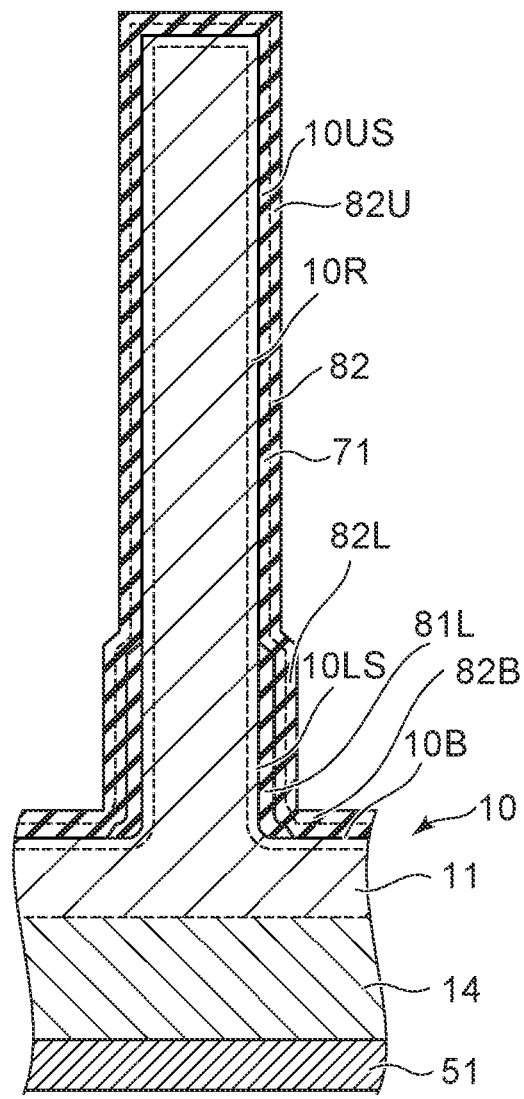
FIG. 20 is a schematic cross-sectional view in the order of process illustrating the method for manufacturing the semiconductor device according to the second embodiment.

As shown in FIG. 20, a second film 82 including a second element is formed on the bottom surface 10B of the hole 10H, the first lower side surface region 81L, and the upper side surface 10US of the hole 10H. The second element includes at least one selected from the group consisting of nitrogen, aluminum, hafnium and zirconium.

At this time, a first insulating film 71 may be formed between the above removal of the first bottom surface region 81B and the first upper side surface region 81U and the formation of the second film 82. The first insulating film 71 includes silicon and oxygen. The first insulating film 71 do not include the first element or the second element substantially. The first insulating film 71 is, for example, a $SiO_2$ film. The first insulating film 71 is formed on the bottom surface 10B, the first lower side surface region 81L, and the upper side surface 10US. In this case, the second film 82 is formed on the first insulating film 71.

The second film 82 includes a second bottom surface region 82B provided on the bottom surface 10B of the hole 10H, a second lower side surface region 82L provided on the first lower side surface region 81L, and a second upper side area 82U provided on the upper side surface 10US of the hole 10H.

Figure 21:
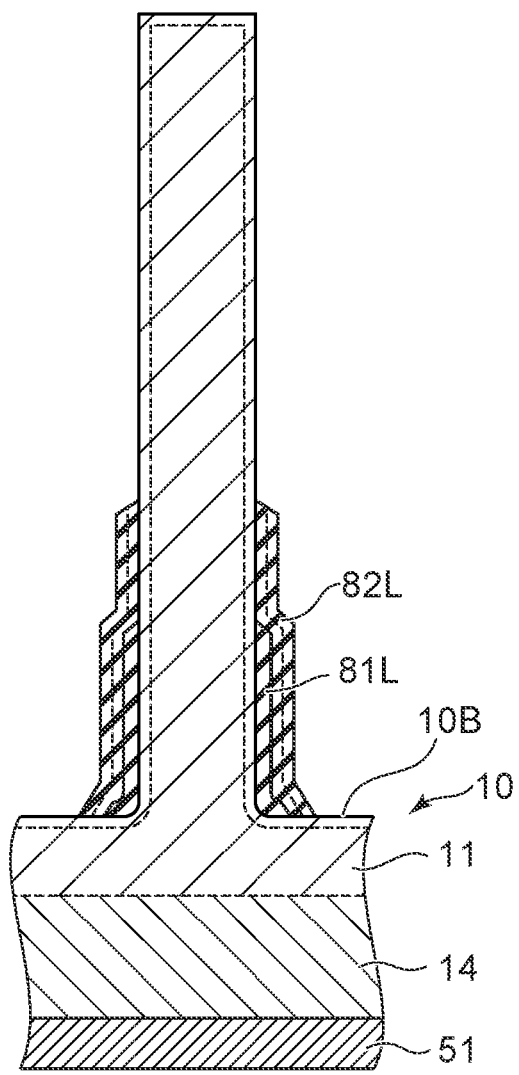
FIG. 21 is a schematic cross-sectional view in the order of process illustrating the method for manufacturing the semiconductor device according to the second embodiment.

As shown in FIG. 21, the second bottom surface region 82B and the second upper side surface region 82U are removed while leaving the second lower side surface region 82L. For example, the bottom surface 10B of the hole 10H and the upper side surface 10US of the hole 10H are exposed.

Figure 22:
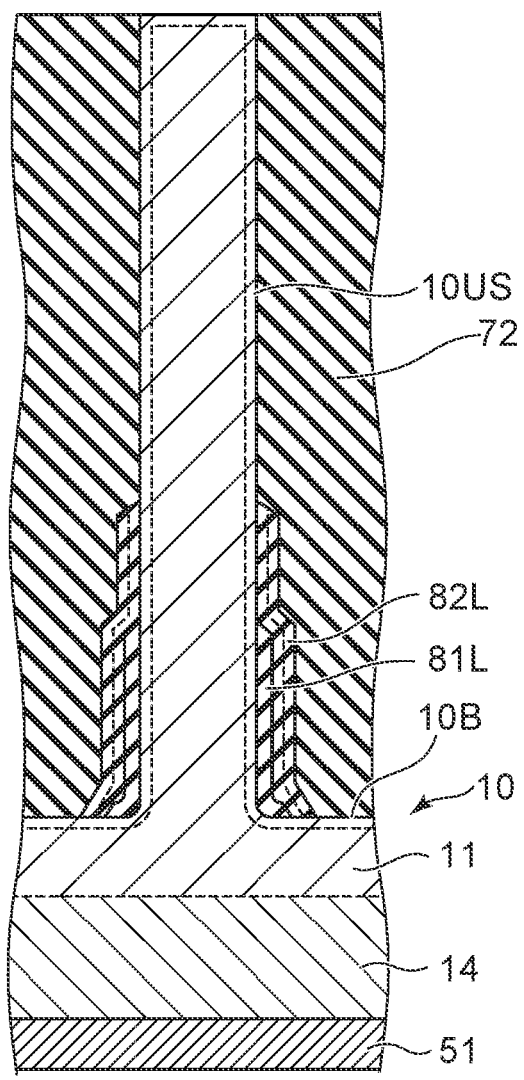
FIG. 22 is a schematic cross-sectional view in the order of process illustrating the method for manufacturing the semiconductor device according to the second embodiment.

As shown in FIG. 22, a second insulating film 72 is formed on the bottom surface 10B of the hole 10H, the second lower side surface region 82L, and the upper side surface 10US of the hole 10H. The second insulating film 72 includes silicon and oxygen. The second insulating film 72 is, for example, a $SiO_2$ film.

If necessary, a third film including the first element or the second element may be formed in the same manner as the above-mentioned formation of the second film 82. These films correspond to, for example, the above-mentioned first to third regions 45a to 45c.

Figure 23:
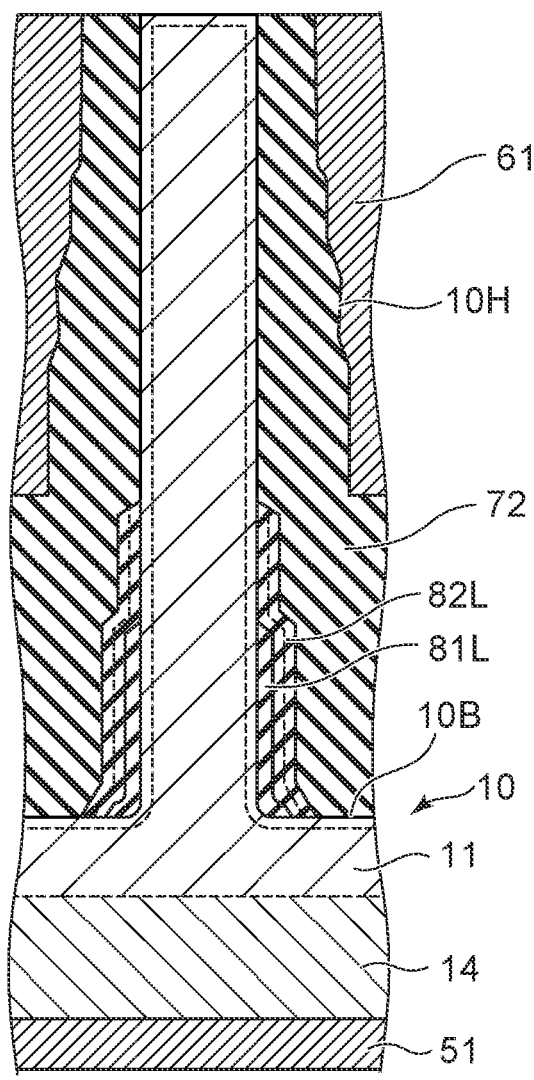
FIG. 23 is a schematic cross-sectional view in the order of process illustrating the method for manufacturing the semiconductor device according to the second embodiment.

As shown in FIG. 23, the first conductive member 61 is formed in the hole 10H after the formation of the second insulating film 72.

Thereby, for example, the semiconductor device 111 can be formed. According to the manufacturing method according to the embodiment, it is possible to provide a manufacturing method of a semiconductor device capable of improving characteristics.

In the above embodiment, the carrier concentration of the first conductive type in the first semiconductor region 11 is preferably, for example, not less than $1.0 \times 10^{15}$ cm$^{-3}$ and not more than $1.0 \times 10^{17}$ cm$^{-3}$. The carrier concentration of the second conductive type in the second semiconductor region 12 is preferably, for example, not less than $1.0 \times 10^{16}$ cm$^{-3}$ and not more than $1.0 \times 10^{18}$ cm$^{-3}$. The carrier concentration of the first conductive type in the third semiconductor region 13 is preferably, for example, not less than $3.0 \times 10^{18}$ cm$^{-3}$ and not more than $3.0 \times 10^{20}$ cm$^{-3}$. The carrier concentration of the first conductive type in the fourth semiconductor region 14 is preferably, for example, not less than $1.0 \times 10^{17}$ cm$^{-3}$ and not more than $3.0 \times 10^{20}$ cm$^{-3}$. The carrier concentration of the second conductive type in the fifth semiconductor region 15 is preferably, for example, not less than $1.0 \times 10^{18}$ cm$^{-3}$ and not more than $3.0 \times 10^{20}$ cm$^{-3}$.

In the above embodiment, for example, the concentration of impurity of the first conductive type in the third semiconductor region 13 is higher than the concentration of impurity of the first conductive type in the first semiconductor region 11. For example, the concentration of impurity of the first conductive type in the fourth semiconductor region 14 is higher than the impurity concentration of the first conductive type in the first semiconductor region 11. For example, the concentration of impurity of the second conductive type in the fifth semiconductor region 15 is higher than the concentration of impurity of the second conductive type in the second semiconductor region 12.

The impurity concentration of the first conductive type in the first semiconductor region 11 is preferably, for example, not less than $1.0 \times 10^{15}$ cm$^{-3}$ and not more than $1.0 \times 10^{17}$ cm$^{-3}$ or less. The impurity concentration of the second conductive type in the second semiconductor region 12 is preferably, for example, not less than $1.0 \times 10^{16}$ cm$^{-3}$ and not more than $1.0 \times 10^{18}$ cm$^{-3}$. The impurity concentration of the first conductive type in the third semiconductor region 13 is preferably, for example, not less than $3.0 \times 10^{18}$ cm$^{-3}$ and not more than $3.0 \times 10^{20}$ cm$^{-3}$. The impurity concentration of the first conductive type in the fourth semiconductor region 14 is preferably, for example, not less than $1.0 \times 10^{17}$ cm$^{-3}$ and not more than $3.0 \times 10^{20}$ cm$^{-3}$. The impurity concentration of the second conductive type in the fifth semiconductor region 15 is preferably, for example, not less than $1.0 \times 10^{18}$ cm$^{-3}$ and not more than $3.0 \times 10^{20}$ cm$^{-3}$.

In the embodiment, information on the shape of the semiconductor region and the like can be obtained by, for example, electron microscope observation. Information on the concentration of the first element or the like can be obtained by, for example, EDX (Energy Dispersive X-ray Spectroscopy) or SIMS (Secondary Ion Mass Spectrometry). Information on the carrier concentration in the semiconductor region can be obtained by, for example, SCM (Scanning Capacitance Microscopy).

According to the embodiment, it is possible to provide a semiconductor device having improved characteristics and a method for manufacturing the same.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing the same practicable by an appropriate design modification by one skilled in the art based on the semiconductor devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the first electrode to the second electrode being along a first direction;
   a third electrode, the third electrode including a third electrode end portion and a third electrode other end portion, the third electrode end portion being located between the first electrode and the third electrode other end portion in the first direction;
   a first conductive member including a first conductive member end portion and a first conductive member other end portion, the first conductive member end portion being located between the first electrode and the first conductive member other end portion in the first direction, a position of the first conductive member end portion in the first direction being between a position of the first electrode in the first direction and a position of the third electrode end portion in the first direction, the first conductive member being electrically connected with one of the second electrode and the third electrode, or the first conductive member being configured to be electrically connected with the one of the second electrode and the third electrode;
   a semiconductor member, the semiconductor member including a first semiconductor region of a first conductive type, a second semiconductor region of a second conductive type, and a third semiconductor region of the first conductive type, the first semiconductor region including a first partial region and a second partial region, the first partial region being located between the first electrode and the second electrode in the first direction, the second semiconductor region being located between the first partial region and the third semiconductor region in the first direction, the third semiconductor region being electrically connected with the second electrode, a second direction from a part of the third electrode to the second semiconductor region crossing the first direction, a direction from an other part of the third electrode to a part of the first partial region being along the second direction, a direction from the second partial region to the first conductive member being along the first direction, and a direction from the first conductive member to the first partial region being along the second direction; and a first insulating member including silicon and oxygen, the first insulating member including a first position, a second position, and a third position, the first position being between the second partial region and the first conductive member end portion in the first direction, the second position being between the first conductive member and the first partial region in the second direction, a direction from the first position to the third position being along the second direction, a position of the third position in the first direction being between a position of the second partial region in the first direction and a position of the second position in the first direction, the first insulating member including a first element including at least one selected from the group consisting of nitrogen, aluminum, hafnium and zirconium at the third position, the first insulating member not including the first element at the first position and the second position, or each of a concentration of the first element at the first position and a concentration of the first element at the second position being lower than a concentration of the first element at the third position.

2. The device according to claim 1, wherein the first insulating member further includes a fourth position, a position of the fourth position in the first direction is between the position of the third position in the first direction and the position of the second position in the first direction, and a concentration of the first element at the fourth position is between the concentration of the first element at the third position and the concentration of the first element at the second position.

3. The device according to claim 1, wherein the first insulating member further includes a fifth position, the fifth position is located between the third electrode and the second semiconductor region in the second direction, and the first insulating member does not include the first element at the fifth position, or a concentration of the first element at the fifth position is lower than the concentration of the first element at the third position.

4. A semiconductor device, comprising:

a first electrode;

a second electrode, a direction from the first electrode to the second electrode being along a first direction;

a third electrode, the third electrode including a third electrode end portion and a third electrode other end portion, the third electrode end portion being located between the first electrode and the third electrode other end portion in the first direction;

a first conductive member including a first conductive member end portion and a first conductive member other end portion, the first conductive member end portion being located between the first electrode and the first conductive member other end portion in the first direction, a position of the first conductive member end portion in the first direction being between a position of the first electrode in the first direction and a position of the third electrode end portion in the first direction, the first conductive member being electrically connected with one of the second electrode and the third electrode, or the first conductive member being configured to be electrically connected with the one of the second electrode and the third electrode;

a semiconductor member, the semiconductor member including a first semiconductor region of a first conductive type, a second semiconductor region of a second conductive type, and a third semiconductor region of the first conductive type, the first semiconductor region including a first partial region and a second partial region, the first partial region being located between the first electrode and the second electrode in the first direction, the second semiconductor region being located between the first partial region and the third semiconductor region in the first direction, the third semiconductor region being electrically connected with the second electrode, a second direction from a part of the third electrode to the second semiconductor region crossing the first direction, a direction from an other part of the third electrode to a part of the first partial region being along the second direction, a direction from the second partial region to the first conductive member being along the first direction, and a direction from the first conductive member to the first partial region being along the second direction;

and a first insulating member including silicon and oxygen, the first insulating member including a first insulating region, a second insulating region, and a third insulating region, the first insulating region being located between the second partial region and the first conductive member end portion in the first direction, the second insulating region being located between the first conductive member and the first partial region in the second direction, a direction from the first insulating region to at least a part of the third insulating region being along the second direction, a position of the third insulating region in the first direction being between a position of the second partial region in the first direction and a position of the second insulating region in the first direction, the third insulating region including a first element including at least one selected from the group consisting of nitrogen, aluminum, hafnium and zirconium, and the first insulating region and the second insulating region not including the first element, or each of a concentration of the first element in the first insulating region and a concentration of the first element in the second insulating region being lower than a concentration of the first element in the third insulating region.

5. The device according to claim 4, wherein
the first insulating member further includes a fourth insulating region,
a position of the fourth insulating region in the first direction is between the position of the third insulating region in the first direction and the position of the second insulating region in the first direction, and
a concentration of the first element in the fourth insulating region is between the concentration of the first element in the third insulating region and the concentration of the first element in the second insulating region.

6. The device according to claim 5, wherein
the first insulating member further includes a fifth insulating region,
the fifth insulating region is located between the third electrode and the second semiconductor region in the second direction, and
the fifth insulating region does not include the first element, or a concentration of the first element in the fifth insulating region is lower than the concentration of the first element in the third insulating region.

7. The device according to claim 4, wherein
the third insulating region includes:
  a first region including the first element;
  a second region including the first element; and
  a first intermediate region provided between the first region and the second region,
the first region is located between a part of the second region and the first partial region in the second direction,
the first intermediate region does not include the first element, or a concentration of the first element in the first intermediate region is lower than a concentration of the first element in the first region, and lower than a concentration of the first element in the second region.

8. The device according to claim 7, wherein the first region is located between the first electrode and an other part of the second region in the first direction.

9. The device according to claim 7, wherein the first region and the part of the second region extend along the first direction.

10. The device according to claim 7, wherein the first region includes a plurality of regions including the first element, and the regions including the first elements are separated from each other in the first direction.

11. The device according to claim 7, wherein
the third insulating region further includes:
  a third region including the first element; and
  a second intermediate region provided between the second region and the third region,
the second region is located between a part of the third region and the first partial region in the second direction, and
the second intermediate region does not include the first element, or a concentration of the first element in the second intermediate region is lower than the concentration of the first element in the second region, and lower than the concentration of the first element in the third region.

12. The device according to claim 11, wherein an other part of the second region is located between the first electrode and an other part of the third region in the first direction.

13. The device according to claim 4, wherein
the third insulating region includes a first direction end portion, and a first direction other end portion,
the first direction end portion is between the second partial region and the first direction other end portion in the first direction,
a first ratio of a second distance to a first distance is not less than 0.15 and not more than 0.85,
the first distance is a distance along the first direction between a position of the first conductive member end portion in the first direction and a position of the third electrode end portion in the first direction, and
the second distance is a distance along the first direction between the position of the first conductive member end portion in the first direction and a position of the first direction other end portion in the first direction.

14. The device according to claim 4, wherein
the third insulating region includes a second direction end portion, and a second direction other end portion,
the second direction end portion is between the second direction other end portion and the first partial region in the second direction,
a second ratio of a fourth distance to a third distance is not less than 0.16 and not more than 0.9,
the third distance is a distance along the second direction between a position of the first conductive member end portion in the second direction and a position of the second direction end portion in the second direction,
the fourth distance is a distance along the second direction between the position of the first conductive member end portion in the second direction and a position of the second direction other end portion in the second direction.

15. A semiconductor device, comprising:
a first electrode;
a second electrode, a direction from the first electrode to the second electrode being along a first direction;
a third electrode, the third electrode including a third electrode end portion and a third electrode other end portion, the third electrode end portion being located between the first electrode and the third electrode other end portion in the first direction;
a first conductive member including a first conductive member end portion and a first conductive member other end portion, the first conductive member end portion being located between the first electrode and the first conductive member other end portion in the first direction, a position of the first conductive member end portion in the first direction being between a position of the first electrode in the first direction and a position of the third electrode end portion in the first direction, the first conductive member being electrically connected with one of the second electrode and the third electrode, or the first conductive member being configured to be electrically connected with the one of the second electrode and the third electrode;
a semiconductor member, the semiconductor member including a first semiconductor region of a first conductive type, a second semiconductor region of a second conductive type, and a third semiconductor region of the first conductive type,
the first semiconductor region including a first partial region and a second partial region,
the first partial region being located between the first electrode and the second electrode in the first direction, the second semiconductor region being located between the first partial region and the third semiconductor region in the first direction,
the third semiconductor region being electrically connected with the second electrode,
a second direction from a part of the third electrode to the second semiconductor region crossing the first direction,
a direction from an other part of the third electrode to a part of the first partial region being along the second direction,
a direction from the second partial region to the first conductive member being along the first direction, and
a direction from the first conductive member to the first partial region being along the second direction; and
a first insulating member including silicon and oxygen, the first insulating member including a first insulating region, a second insulating region, and a third insulating region,
the first insulating region being located between the second partial region and the first conductive member end portion in the first direction,
the second insulating region being located between the first conductive member and the first partial region in the second direction,
a direction from the first insulating region to at least a part of the third insulating region being along the second direction,
a position of the third insulating region in the first direction being between a position of the second partial region in the first direction and a position of the second insulating region in a first direction,
the third insulating region including:
a first region including a first element, the first element including at least one selected from the group consisting of nitrogen, aluminum, hafnium and zirconium;
a second region including the first element; and
a first intermediate region provided between the first region and the second region,
the first region being located between a part of the second region and the first partial region in the second direction,
the first intermediate region not including the first element, or a concentration of the first element in the first intermediate region being lower than a concentration of the first element in the first region, and lower than a concentration of the first element in the second region,
the first insulating region and the second insulating region not including the first element, or each of a concentration of the first element in the first insulating region and a concentration of the first element in the second insulating region being lower than the concentration of the first element in the first region and lower than the concentration of the first element in the second region.

16. The device according to claim 15, wherein the first region is located between the first electrode and an other part of the second region in the first direction.

17. The device according to claim 16, wherein
the third insulating region further includes:
a third region including the first element; and
a second intermediate region provided between the second region and the third region,
the second region is located between a part of the third region and the first partial region in the second direction, and
the second intermediate region does not include the first element, or a concentration of the first element in the second intermediate region is lower than the concentration of the first element in the second region, and lower than the concentration of the first element in the third region.

\* \* \* \* \*